(12) United States Patent
DeCeanne et al.

(10) Patent No.: US 11,358,897 B2
(45) Date of Patent: Jun. 14, 2022

(54) BLACK B-SPODUMENE GLASS CERAMICS WITH AN OPTIMIZED COLOR PACKAGE

(71) Applicant: CORNING INCORPORATED, Corning, NY (US)

(72) Inventors: Anthony Vincent DeCeanne, Peoria, IL (US); Qiang Fu, Painted Post, NY (US); Alana Marie Whittier, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 666 days.

(21) Appl. No.: 16/202,731

(22) Filed: Nov. 28, 2018

(65) Prior Publication Data

US 2019/0161396 A1    May 30, 2019

Related U.S. Application Data

(60) Provisional application No. 62/592,723, filed on Nov. 30, 2017.

(51) Int. Cl.
| | |
|---|---|
| *C03C 10/12* | (2006.01) |
| *C03C 10/02* | (2006.01) |
| *C03C 10/00* | (2006.01) |
| *C03C 4/18* | (2006.01) |
| *H05K 5/00* | (2006.01) |
| *H05K 5/03* | (2006.01) |
| *C03C 4/02* | (2006.01) |
| *C03C 3/085* | (2006.01) |
| *C03C 21/00* | (2006.01) |
| *H04M 1/02* | (2006.01) |

(52) U.S. Cl.
CPC .......... *C03C 10/0027* (2013.01); *C03C 3/085* (2013.01); *C03C 4/02* (2013.01); *C03C 4/18* (2013.01); *C03C 10/0054* (2013.01); *H05K 5/0017* (2013.01); *H05K 5/03* (2013.01); *C03C 21/002* (2013.01); *C03C 2204/00* (2013.01); *H04M 1/0202* (2013.01)

(58) Field of Classification Search
CPC ................................................. C03C 10/0027
See application file for complete search history.

(56) References Cited

U.S. PATENT DOCUMENTS

| | | |
|---|---|---|
| 3,681,097 A | 8/1972 | Beall et al. |
| 5,070,044 A | 12/1991 | Pinckney |
| (Continued) | | |

FOREIGN PATENT DOCUMENTS

| | | |
|---|---|---|
| EP | 0711737 A1 | 5/1996 |
| WO | 2009134445 A1 | 11/2009 |
| WO | 2014/035791 A2 | 3/2014 |

OTHER PUBLICATIONS

Beall and Pinckney, "Nanophase glass-ceramics," Journal of the American Ceramic Society, 1999, 82(1): pp. 5-16.
(Continued)

*Primary Examiner* — Karl E Group

(57) ABSTRACT

A black β-spodumene glass ceramic is provided. The glass ceramic includes β-spodumene as a primary crystal phase and gahnite as a minor crystal phase. The glass ceramic is characterized by the color coordinates: L*: 20.0 to 40.0, a*: −1.0 to 0.5, and b*: −5.0 to 1.0. The glass ceramic may be ion exchanged. Methods for producing the glass ceramic are also provided.

45 Claims, 9 Drawing Sheets

(56) References Cited

U.S. PATENT DOCUMENTS

| | | | |
|---|---|---|---|
| 5,173,453 | A | 12/1992 | Beall et al. |
| 5,491,115 | A | 2/1996 | Pfitzenmaier et al. |
| 7,476,633 | B2 | 1/2009 | Comte et al. |
| 8,664,131 | B2 | 3/2014 | Beall et al. |
| 9,115,023 | B2* | 8/2015 | Beall .................. C03B 20/00 |
| 9,701,573 | B2 | 7/2017 | Beall et al. |
| 2005/0016521 | A1 | 1/2005 | Witzmann et al. |
| 2014/0066285 | A1* | 3/2014 | Beall .................. C03C 3/097 |
| | | | 501/32 |
| 2015/0321947 | A1 | 11/2015 | Beall et al. |
| 2016/0102010 | A1 | 4/2016 | Beall et al. |
| 2017/0369361 | A1* | 12/2017 | Beall .................. C03C 14/006 |

OTHER PUBLICATIONS

Dejneka et al., "Chemically strengthened low crystallinity black glass-ceramics with high liquidus viscosities," International Journal of Applied Glass Science, 2014, 5(2): pp. 146-160.

Hummel, "Thermal expansion properties of some synthetic lithia minerals," Journal of the American Ceramic Society, 1951, 34(8): pp. 235-239.

Park et al., "Heat-resistant ceramics based on LAS-system non-metallic mineral and its thermal shock resistance," Journal of the Ceramic Society of Japan, 2010, 118(3): pp. 220-225.

Shelby, "Chapter 10: Optical Properties" in Introduction to Glass Science and Technology, pp. 202-221. the Royal Society of Chemistry, 2005, Cambridge, UK.

Varshneya, "Chapter 19: Optical Properties" in Fundamentals of Inorganic Glasses, Academic Press Inc. 1994, pp. 455-506, San Diego, CA.

International Search Report and Written Opinion PCT/US2018/063221 dated Feb. 21, 2019, 17 Pgs.

* cited by examiner

BLACK β-SPODUMENE GLASS CERAMICS WITH AN OPTIMIZED COLOR PACKAGE

RELATED APPLICATIONS

This application claims the benefit of priority of U.S. Provisional Application Ser. No. 62/592,723 filed on Nov. 30, 2017, the contents of which are relied upon and incorporated herein by reference in their entirety.

BACKGROUND

Field

The present specification generally relates to glass ceramic compositions. More specifically, the present specification is directed to black β-spodumene glass ceramics that may be formed into housings for electronic devices.

Technical Background

Portable electronic devices, such as, smartphones, tablets, and wearable devices (such as, for example, watches and fitness trackers) continue to get smaller and more complex. As such, materials that are conventionally used on at least one external surface of such portable electronic devices also continue to get more complex. For instance, as portable electronic devices get smaller and thinner to meet consumer demand, the housings used in these portable electronic devices also get smaller and thinner, resulting in higher performance requirements for the materials used to form these components.

Accordingly, a need exists for materials that exhibit higher performance, such as resistance to damage, and a pleasing appearance for use in portable electronic devices.

SUMMARY

According to aspect (1), a glass ceramic is provided. The glass ceramic comprises: a β-spodumene crystal phase as a primary crystal phase; and a gahnite crystal phase as a minor crystal phase. The glass ceramic is characterized by the following color coordinates: L*: 20.0 to 40.0; a*: −1.0 to 0.5; and b*: −5.0 to 1.0.

According to aspect (2), the glass ceramic of aspect (1) is provided, further comprising pseudobrookite as a minor crystal phase.

According to aspect (3), the glass ceramic of aspect (1) or (2) is provided, further comprising armalcolite as a minor crystal phase.

According to aspect (4), the glass ceramic of any of aspects (1) to (3) is provided, wherein the glass ceramic has a transmittance of less than or equal to 1% in the visible light range.

According to aspect (5), the glass ceramic of any of aspects (1) to (4) is provided, further comprising: greater than or equal to 60 wt % to less than or equal to 70 wt % $SiO_2$; greater than or equal to 15 wt % to less than or equal to 25 wt % $Al_2O_3$; greater than or equal to 3 wt % to less than or equal to 5 wt % $Li_2O$; greater than or equal to 0 wt % to less than or equal to 2 wt % $Na_2O$; greater than or equal to 0.5 wt % to less than or equal to 3 wt % MgO; greater than or equal to 0.5 wt % to less than or equal to 4 wt % ZnO; greater than or equal to 2 wt % to less than or equal to 6 wt % $TiO_2$; greater than or equal to 0.1 wt % to less than or equal to 1.0 wt % $SnO_2$; greater than or equal to 0.2 wt % to less than or equal to 3.0 wt % $Fe_2O_3$; and greater than or equal to 0.1 wt % to less than or equal to 2.0 wt % $Co_3O_4$.

According to aspect (6), the glass ceramic of any of aspects (1) to (5) is provided, further comprising greater than or equal to 65 wt % to less than or equal to 67 wt % $SiO_2$.

According to aspect (7), the glass ceramic of any of aspects (1) to (6) is provided, further comprising less than or equal to 15 wt % $Li_2O$.

According to aspect (8), the glass ceramic of any of aspects (1) to (7) is provided, further comprising greater than or equal to 0 wt % to less than or equal to 5 wt % $Na_2O$.

According to aspect (9), the glass ceramic of any of aspects (1) to (6) is provided, further comprising greater than 0 wt % to less than less than or equal to 1.5 wt % $Fe_2O_3$.

According to aspect (10), the glass ceramic of any of aspects (1) to (9) is provided, wherein the glass ceramic has a crystallinity of greater than or equal to 50 wt %.

According to aspect (11), the glass ceramic of any of aspects (1) to (10) is provided, wherein β-spodumene is the only primary crystal phase.

According to aspect (12), the glass ceramic of any of aspects (1) to (11) is provided, further comprising a grain size of greater than or equal to 0.1 μm to less than or equal to 1.0 μm.

According to aspect (13), the glass ceramic of any of aspects (1) to (12) is provided, wherein the glass ceramic is ion exchanged and comprises a compressive stress layer extending from a surface of the glass ceramic into the glass ceramic.

According to aspect (14), a consumer electronic product is provided. The consumer electronic product comprises: a housing comprising a front surface, a back surface and side surfaces; electrical components at least partially within the housing, the electrical components comprising at least a controller, a memory, and a display, the display at or adjacent the front surface of the housing; and a cover glass disposed over the display. At least a portion of the housing comprises the glass ceramic of any of aspects (1) to (12).

According to aspect (15), a consumer electronic product is provided. The consumer electronic product comprises: a housing comprising a front surface, a back surface and side surfaces; electrical components at least partially within the housing, the electrical components comprising at least a controller, a memory, and a display, the display at or adjacent the front surface of the housing; and a cover glass disposed over the display. At least a portion of the housing comprises the glass ceramic of aspect (13).

According to aspect (16), a glass ceramic is provided. The glass ceramic comprises: a β-spodumene crystal phase as a primary crystal phase; greater than or equal to 0.2 wt % to less than or equal to 3.0 wt % $Fe_2O_3$; and greater than or equal to 0.1 wt % to less than or equal to 2.0 wt % $Co_3O_4$. The glass ceramic is characterized by the following color coordinates: L*: 20.0 to 40.0; a*: −1.0 to 0.5; and b*: −5.0 to 1.0.

According to aspect (17), the glass ceramic of aspect (16) is provided, further comprising pseudobrookite as a minor crystal phase.

According to aspect (18), the glass ceramic of aspect (16) or (17) is provided, further comprising armalcolite as a minor crystal phase.

According to aspect (19), the glass ceramic of any of aspects (16) to (18) is provided, further comprising gahnite as a minor crystal phase.

According to aspect (20), the glass ceramic of any of aspects (16) to (19) is provided, wherein the glass ceramic has a transmittance of less than or equal to 1% in the visible light range.

According to aspect (21), the glass ceramic of any of aspects (16) to (20) is provided, further comprising: greater than or equal to 60 wt % to less than or equal to 70 wt % $SiO_2$; greater than or equal to 15 wt % to less than or equal to 25 wt % $Al_2O_3$; greater than or equal to 3 wt % to less than or equal to 5 wt % $Li_2O$; greater than or equal to 0 wt % to less than or equal to 2 wt % $Na_2O$; greater than or equal to 0.5 wt % to less than or equal to 3 wt % MgO; greater than or equal to 0.5 wt % to less than or equal to 4 wt % ZnO; greater than or equal to 2 wt % to less than or equal to 6 wt % $TiO_2$; greater than or equal to 0.1 wt % to less than or equal to 1.0 wt % $SnO_2$; greater than or equal to 0.2 wt % to less than or equal to 3.0 wt % $Fe_2O_3$; and greater than or equal to 0.1 wt % to less than or equal to 2.0 wt % $Co_3O_4$.

According to aspect (22), the glass ceramic of any of aspects (16) to (21) is provided, further comprising greater than or equal to 65 wt % to less than or equal to 67 wt % $SiO_2$.

According to aspect (23), the glass ceramic of any of aspects (16) to (22) is provided, further comprising less than or equal to 15 wt % $Li_2O$.

According to aspect (24), the glass ceramic of any of aspects (16) to (23) is provided, further comprising greater than or equal to 0 wt % to less than or equal to 5 wt % $Na_2O$.

According to aspect (25), the glass ceramic of any of aspects (16) to (24) is provided, further comprising greater than or equal to 0.2 wt % to less than or equal to 1.5 wt % $Fe_2O_3$.

According to aspect (26), the glass ceramic of any of aspects (16) to (25) is provided, wherein the glass ceramic has a crystallinity of greater than or equal to 50 wt %.

According to aspect (27), the glass ceramic of any of aspects (16) to (26) is provided, wherein β-spodumene is the only primary crystal phase.

According to aspect (28), the glass ceramic of any of aspects (16) to (27) is provided, further comprising a grain size of greater than or equal to 0.1 μm to less than or equal to 1.0 μm.

According to aspect (29), the glass ceramic of any of aspects (16) to (28) is provided, wherein the glass ceramic is ion exchanged and comprises a compressive stress layer extending from a surface of the glass ceramic into the glass ceramic.

According to aspect (30), a consumer electronic product is provided. The consumer electronic product comprises: a housing comprising a front surface, a back surface and side surfaces; electrical components at least partially within the housing, the electrical components comprising at least a controller, a memory, and a display, the display at or adjacent the front surface of the housing; and a cover glass disposed over the display. At least a portion of the housing comprises the glass ceramic of any of aspects (16) to (28).

According to aspect (31), a consumer electronic product is provided. The consumer electronic product comprises: a housing comprising a front surface, a back surface and side surfaces; electrical components at least partially within the housing, the electrical components comprising at least a controller, a memory, and a display, the display at or adjacent the front surface of the housing; and a cover glass disposed over the display. At least a portion of the housing comprises the glass ceramic of aspect (29).

According to aspect (32), a method is provided. The method comprises: nucleating a precursor glass-based article to form a nucleated glass-based article; ceramming the nucleated glass-based article to form a glass ceramic. The glass ceramic comprises: a β-spodumene crystal phase as a primary crystal phase; and a gahnite crystal phase as a minor crystal phase. The glass ceramic is characterized by the following color coordinates: L*: 20.0 to 40.0; a*: −1.0 to 1.0; and b*: −5.0 to 2.0.

According to aspect (33), the method of aspect (32) is provided, wherein the ceramming occurs at a temperature of greater than or equal to 900° C. to less than or equal to 1100° C.

According to aspect (34), the method of aspect (32) or (33) is provided, wherein the ceramming occurs for a period of greater than or equal to 0.25 hours to less than or equal to 16 hours.

According to aspect (35), the method of any of aspects (32) to (34) is provided, wherein the nucleating occurs at a temperature of greater than or equal to 725° C. to less than or equal to 850° C.

According to aspect (36), the method of any of aspects (32) to (35) is provided, wherein the nucleating occurs for a period of greater than or equal to 0.5 hours to less than or equal to 6 hours.

According to aspect (37), the method of any of aspects (32) to (36) is provided, further comprising ion exchanging the glass ceramic.

According to aspect (38), the method of any of aspects (32) to (37) is provided, wherein the precursor glass-based article comprises: greater than or equal to 60 wt % to less than or equal to 70 wt % $SiO_2$; greater than or equal to 15 wt % to less than or equal to 25 wt % $Al_2O_3$; greater than or equal to 3 wt % to less than or equal to 5 wt % $Li_2O$; greater than or equal to 0 wt % to less than or equal to 2 wt % $Na_2O$; greater than or equal to 0.5 wt % to less than or equal to 3 wt % MgO; greater than or equal to 0.5 wt % to less than or equal to 4 wt % ZnO; greater than or equal to 2 wt % to less than or equal to 6 wt % $TiO_2$; greater than or equal to 0.1 wt % to less than or equal to 1.0 wt % $SnO_2$; greater than or equal to 0.2 wt % to less than or equal to 3.0 wt % $Fe_2O_3$; and greater than or equal to 0.1 wt % to less than or equal to 2.0 wt % $Co_3O_4$.

According to aspect (39), the method of any of aspects (32) to (38) is provided, wherein the precursor glass-based article comprises greater than 0 wt % to less than or equal to 1.5 wt % $Fe_2O_3$.

According to aspect (40), a method is provided. The method comprises: nucleating a precursor glass-based article to form a nucleated glass-based article; ceramming the nucleated glass-based article to form a glass ceramic. The glass ceramic comprises: a β-spodumene crystal phase as a primary crystal phase; greater than or equal to 0.2 wt % to less than or equal to 3.0 wt % $Fe_2O_3$; and greater than or equal to 0.1 wt % to less than or equal to 2.0 wt % $Co_3O_4$. The glass ceramic is characterized by the following color coordinates: L*: 20.0 to 40.0; a*: −1.0 to 1.0; and b*: −5.0 to 2.0.

According to aspect (41), the method of aspect (40) is provided, wherein the ceramming occurs at a temperature of greater than or equal to 900° C. to less than or equal to 1100° C.

According to aspect (42), the method of aspect (40) or (41) is provided, wherein the ceramming occurs for a period of greater than or equal to 0.25 hours to less than or equal to 16 hours.

According to aspect (43), the method of any of aspects (40) to (42) is provided, wherein the nucleating occurs at a temperature of greater than or equal to 725° C. to less than or equal to 850° C.

According to aspect (44), the method of any of aspects (40) to (43) is provided, wherein the nucleating occurs for a period of greater than or equal to 0.5 hours to less than or equal to 6 hours.

According to aspect (45), the method of any of aspects (40) to (44) is provided, further comprising ion exchanging the glass ceramic.

According to aspect (46), the method of any of aspects (40) to (45) is provided, wherein the precursor glass-based article comprises: greater than or equal to 60 wt % to less than or equal to 70 wt % $SiO_2$; greater than or equal to 15 wt % to less than or equal to 25 wt % $Al_2O_3$; greater than or equal to 3 wt % to less than or equal to 5 wt % $Li_2O$; greater than or equal to 0 wt % to less than or equal to 2 wt % $Na_2O$; greater than or equal to 0.5 wt % to less than or equal to 3 wt % MgO; greater than or equal to 0.5 wt % to less than or equal to 4 wt % ZnO; greater than or equal to 2 wt % to less than or equal to 6 wt % $TiO_2$; greater than or equal to 0.1 wt % to less than or equal to 1.0 wt % $SnO_2$; greater than or equal to 0.2 wt % to less than or equal to 3.0 wt % $Fe_2O_3$; and greater than or equal to 0.1 wt % to less than or equal to 2.0 wt % $Co_3O_4$.

According to aspect (47), the method of any of aspects (40) to (45) is provided, wherein the precursor glass-based article comprises greater than or equal to 0.2 wt % to less than or equal to 1.5 wt % $Fe_2O_3$.

According to aspect (48), a glass is provided. The glass comprises: greater than or equal to 60 wt % to less than or equal to 70 wt % $SiO_2$; greater than or equal to 15 wt % to less than or equal to 25 wt % $Al_2O_3$; greater than or equal to 3 wt % to less than or equal to 5 wt % $Li_2O$; greater than or equal to 0 wt % to less than or equal to 2 wt % $Na_2O$; greater than or equal to 0.5 wt % to less than or equal to 3 wt % MgO; greater than or equal to 0.5 wt % to less than or equal to 4 wt % ZnO; greater than or equal to 2 wt % to less than or equal to 6 wt % $TiO_2$; greater than or equal to 0.1 wt % to less than or equal to 1.0 wt % $SnO_2$; greater than or equal to 0.2 wt % to less than or equal to 3.0 wt % $Fe_2O_3$; and greater than or equal to 0.1 wt % to less than or equal to 2.0 wt % $Co_3O_4$.

According to aspect (49), the glass of aspect (48) is provided, comprising greater than or equal to 0.2 wt % to less than or equal to 1.5 wt % $Fe_2O_3$.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments and are incorporated into and constitute a part of this specification. The drawings illustrate the various embodiments described herein and, together with the description, serve to explain the principles and operations of the claimed subject matter.

DETAILED DESCRIPTION

Figure 1:
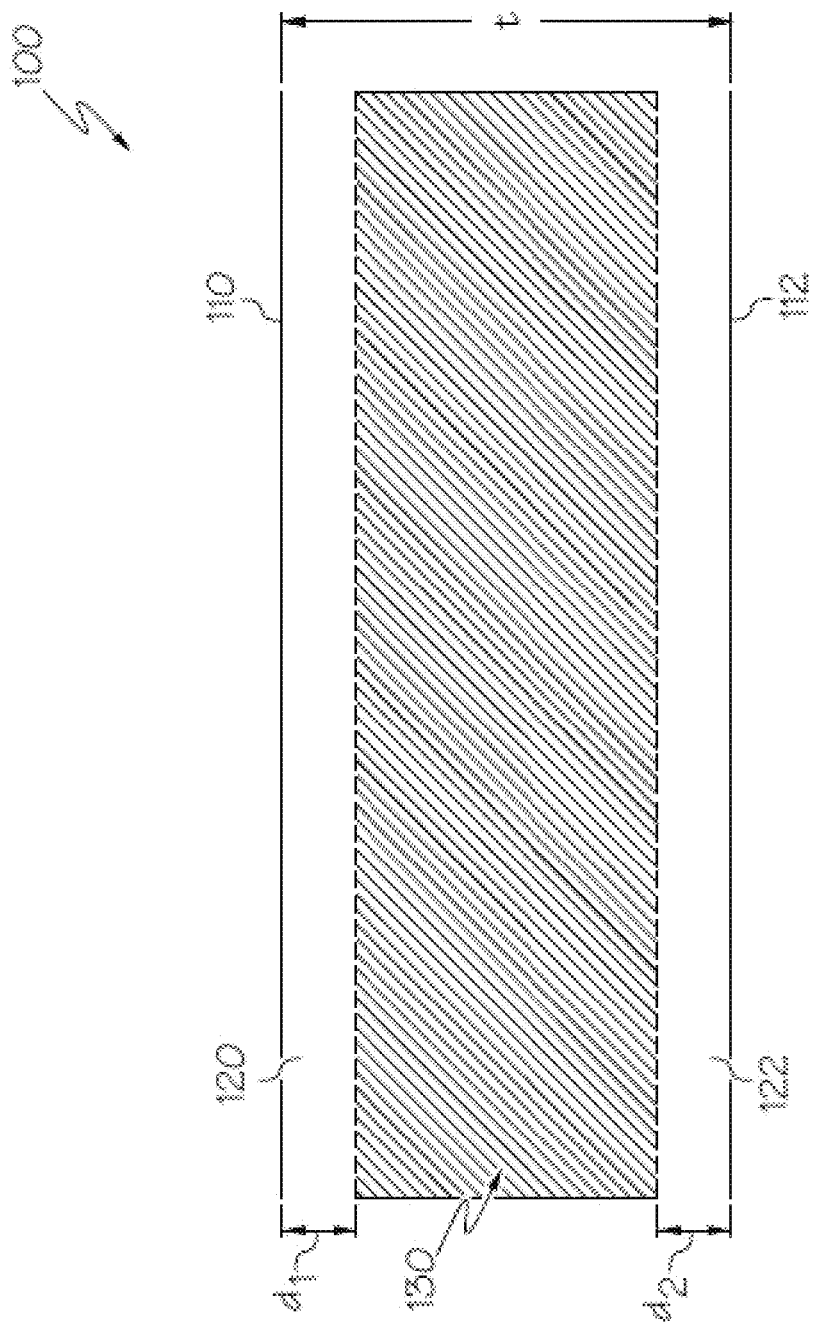
FIG. 1 schematically depicts a cross section of a glass ceramic having compressive stress layers on surfaces thereof according to embodiments disclosed and described herein.

Reference will now be made in detail to black β-spodumene glass ceramics according to various embodiments. In particular, the black β-spodumene glass ceramics have a pleasing appearance, and may be ion exchanged without a significant change in color. Therefore, the black β-spodumene glass ceramics are suitable for use as housings in portable electronic devices.

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. Whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range as well as any ranges therebetween. As used herein, the indefinite articles "a," "an," and the corresponding definite article "the" mean "at least one" or "one or more," unless otherwise specified. It also is understood that the various features disclosed in the specification and the drawings can be used in any and all combinations.

Unless otherwise specified, all compositions of the glasses described herein are expressed in terms of weight percent (wt %), and the constituents are provided on an oxide basis. Unless otherwise specified, all temperatures are expressed in terms of degrees Celsius (° C.).

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. For example, a glass that is "substantially free of $K_2O$" is one in which $K_2O$ is not actively added or batched into the glass, but may be present in very small amounts as a contaminant, such as in amounts of less than about 0.01 wt %. As utilized herein, when the term "about" is used to modify a value, the exact value is also disclosed.

The glass ceramics described herein contain a primary crystal phase, a minor crystal phase, and a residual glass phase. The primary crystal phase is the predominant crystal phase, defined herein as the crystal phase that accounts for the largest fraction of the glass ceramic by weight. Accordingly, the minor crystal phase is present in a weight percent of the glass ceramic that is less than the weight percent of the primary crystal phase.

In embodiments, the primary crystal phase includes β-spodumene. The β-spodumene is characterized by the formula $LiAl(SiO_3)_2$ and has a tetragonal crystal structure. In embodiments, β-spodumene is the only primary crystal phase.

In some embodiments, the glass ceramic includes a minor crystal phase including at least one of gahnite, pseudobrookite, and armalcolite. In embodiments, the minor crystal phase includes gahnite. The gahnite is characterized by the formula $ZnAl_2O_4$ and has an octahedral crystal structure. In some embodiments, additional minor crystal phases may be present in the glass ceramic. The additional minor crystal phases may include pseudobrookite and/or armalcolite, and may be present in addition to the gahnite.

In embodiments, the total crystallinity of the glass ceramic is high enough to provide enhanced mechanical properties, such as hardness, Young's modulus, and scratch resistance. As utilized herein, the total crystallinity is provided in wt % and refers to the sum of the wt % of all the crystal phases present in the glass ceramic. In embodiments, the total crystallinity is greater than or equal to 50 wt %, such as greater than or equal to 55 wt %, greater than or equal to 60 wt %, greater than or equal to 65 wt %, greater than or equal to 70 wt %, greater than or equal to 75 wt %, or more. It should be understood that, in embodiments, any of the above ranges may be combined with any other range. In embodiments, the total crystallinity of the glass ceramic is from greater than or equal to 50 wt % to less than or equal to 75 wt %, such as greater than or equal to 55 wt % to less than or equal to 70 wt %, or greater than or equal to 60 wt % to less than or equal to 65 wt %, and all ranges and sub-ranges between the foregoing values. The total crystallinity of the glass ceramic is determined through Rietveld quantitative analysis of X-ray diffraction (XRD) results.

The crystal phases in the glass ceramic have a small grain size. In some embodiments, the grain size of the crystal phases in the glass ceramic may have a size of greater than or equal to 0.1 μm to less than or equal to 1.0 μm, such as greater than or equal to 0.2 μm to less than or equal to 0.9 μm, greater than or equal to 0.3 μm to less than or equal to 0.8 μm, greater than or equal to 0.4 μm to less than or equal to 0.7 μm, or greater than or equal to 0.5 μm to less than or equal to 0.6 μm, and all ranges and sub-ranges between the foregoing values.

The glass ceramics disclosed herein are opaque. In embodiments, the glass ceramics exhibit a transmittance of less than or equal to 10% in the visible range (380 nm to 760 nm), such as less than or equal to 9%, less than or equal to 8%, less than or equal to 7%, less than or equal to 6%, less than or equal to 5%, less than or equal to 4%, less than or equal to 3%, less than or equal to 2%, less than or equal to 1%, less than or equal to 0.75%, less than or equal to 0.5%, or less. The transmittance as utilized herein refers to total transmittance, and is measured using a Perkin Elmer Lambda 950 UV/Vis/NIR spectrophotometer with a 150 mm integrating sphere. The samples are mounted at the sphere's entrance port, which allows for the collection of wide angle scattered light, and a reference Spectralon reflectance disc is located over the sphere's exit port. The total transmittance is generated relative to an open beam baseline measurement.

In embodiments, the glass ceramics are black. The glass ceramics may be characterized by the following color coordinates: L* 20.0 to 40.0, a* −1.0 to 0.5, and b* −5.0 to 1.0. In some embodiments, the L* value of the glass ceramic may be from 20.0 to 40.0, such as from 21.0 to 39.0, from 22.0 to 38.0, from 23.0 to 37.0, from 24.0 to 36.0, from 23.0 to 35.0, from 25.0 to 34.0, from 26.0 to 33.0, from 27.0 to 32.0, from 28.0 to 31.0, or from 29.0 to 30.0%, and all ranges and sub-ranges between the foregoing values. In some embodiments, the a* value of the glass ceramic may be from −1.0 to 0.5, such as from −0.9 to 0.4, from −0.8 to 0.3, from −0.7 to 0.2, from −0.6 to 0.1, from −0.5 to 0.0, or from −0.4 to −0.1, from −0.3 to −0.2, and all ranges and sub-ranges between the foregoing values. In some embodiments, the b* value of the glass ceramic may be from −5.0 to 1.0, such as from −4.5 to 0.5, from −4.0 to 0.0, from −3.5 to −0.5, from −3.0 to −1.0, from −2.5 to −1.5, or −2.0, and all ranges and sub-ranges between the foregoing values. As utilized herein, the color coordinates are measured using an X-rite Ci7 F02 illuminant under SCI UVC conditions.

The composition of the β-spodumene glass ceramics will now be described. In embodiments of glass ceramics described herein, the concentration of constituent components (e.g., $SiO_2$, $Al_2O_3$, $Li_2O$, $Na_2O$ and the like) are given in weight percent (wt %) on an oxide basis, unless otherwise specified. Components of the glass ceramics according to embodiments are discussed individually below. It should be understood that any of the variously recited ranges of one component may be individually combined with any of the variously recited ranges for any other component.

In embodiments of the glass ceramics disclosed herein, $SiO_2$ is the largest constituent. The $SiO_2$ acts as the primary network former and stabilizes the network structure. If the $SiO_2$ is too low, the desired β-spodumene crystal phase may not be successfully formed. Pure $SiO_2$ has a relatively low CTE and is alkali free. However, pure $SiO_2$ has a high melting point. Accordingly, if the concentration of $SiO_2$ in the glass ceramic is too high, the formability of the precursor glass composition used to form the glass ceramics may be diminished as higher concentrations of $SiO_2$ increase the difficulty of melting the glass, which, in turn, adversely impacts the formability of the precursor glass. In embodiments, the glass composition generally comprises $SiO_2$ in an amount greater than or equal to 60.0 wt %, such as greater than or equal to 61.0 wt %, greater than or equal to 62.0 wt %, greater than or equal to 63.0 wt %, greater than or equal to 64.0 wt %, greater than or equal to 65.0 wt %, greater than or equal to 66.0 wt %, greater than or equal to 67.0 wt %, greater than or equal to 68.0 wt %, or greater than or equal to 69.0 wt %. In embodiments, the glass composition comprises $SiO_2$ in amounts less than or equal to 70.0 wt %, such as less than or equal to 69.0 wt %, less than or equal to 68.0 wt %, less than or equal to 67.0 wt %, less than or equal to 66.0 wt %, less than or equal to 65.0 wt %, less than or equal to 64.0 wt %, less than or equal to 63.0 wt %, less than or equal to 62.0 wt %, or less than or equal to 61.0 wt %. It should be understood that, in embodiments, any of the above ranges may be combined with any other range. In embodiments, the glass composition comprises $SiO_2$ in an amount from greater than or equal to 60.0 wt % to less than or equal to 70.0 wt %, such as from greater than or equal to 61.0 wt % to less than or equal to 69.0 wt %, from greater than or equal to 62.0 wt % to less than or equal to 68.0 wt %, from greater than or equal to 63.0 wt % to less than or equal to 67.0 wt %, from greater than or equal to 64.0 wt % to less than or equal to 66.0 wt %, or from greater than or equal to 65.0 wt % to less than or equal to 67.0 wt %, and all ranges and sub-ranges between the foregoing values.

The glass ceramics of embodiments may further comprise $Al_2O_3$. $Al_2O_3$ may increase the viscosity of the precursor glass compositions used to form the glass ceramics due to its tetrahedral coordination in a glass melt formed from a glass composition, decreasing the formability of the glass composition when the amount of $Al_2O_3$ is too high. However, when the concentration of $Al_2O_3$ is balanced against the concentration of $SiO_2$ and the concentration of alkali oxides in the glass composition, $Al_2O_3$ can reduce the liquidus temperature of the glass melt, thereby enhancing the liquidus viscosity and improving the compatibility of the glass composition with certain forming processes, such as the fusion forming process. The $Al_2O_3$ in the precursor glass also supplies the aluminum necessary to form the β-spodumene crystal phase when the precursor glass is cerammed to form a glass ceramic. However, if the $Al_2O_3$ content is too high, the amount of β-spodumene crystals formed in the glass ceramic may be undesirably decreased. Similarly to $SiO_2$, the $Al_2O_3$ stabilizes the network structure. In embodiments, the glass composition generally comprises $Al_2O_3$ in a concentration of greater than or equal to 15.0 wt %, such as greater than or equal to 16.0 wt %, greater than or equal to 17.0 wt %, greater than or equal to 18.0 wt %, greater than or equal to 19.0 wt %, greater than or equal to 20.0 wt %, greater than or equal to 21.0 wt %, greater than or equal to 22.0 wt %, greater than or equal to 23.0 wt %, or greater than or equal to 24.0 wt %. In embodiments, the glass composition comprises $Al_2O_3$ in amounts less than or equal to 25.0 wt %, such as less than or equal to 24.0 wt %, less than or equal to 23.0 wt %, less than or equal to 22.0 wt %, less than or equal to 21.0 wt %, less than or equal to 20.0 wt %, less than or equal to 19.0 wt %, less than or equal to 18.0 wt %, less than or equal to 17.0 wt %, or less than or equal to 16.0 wt %. It should be understood that, in embodiments, any of the above ranges may be combined with any other range. In embodiments, the glass composition comprises $Al_2O_3$ in an amount from greater than or equal to 15.0 wt % to less than or equal to 25.0 wt %, such as from greater than or equal to 16.0 wt % to less than or equal to 24.0 wt %, from greater than or equal to 17.0 wt % to less than or equal to 23.0 wt %, from greater than or equal to 18.0 wt % to less than or equal to 22.0 wt %, from greater than or equal to 19.0 wt % to less than or equal to 21.0 wt %, or 20.0 wt %, and all ranges and sub-ranges between the foregoing values.

The glass ceramics of embodiments further comprise $Li_2O$. The addition of lithium in the glass ceramic allows for an ion exchange process and further reduces the softening point of the precursor glass composition. The $Li_2O$ also provides the lithium necessary for the formation of the β-spodumene crystal phase when the precursor glass is cerammed to form a glass ceramic. If the $Li_2O$ content is too high, the forming of the precursor glass becomes difficult. In embodiments, the glass composition generally comprises $Li_2O$ in an amount greater than 0 wt %, such as greater than or equal to 0.5 wt %, greater than or equal to 1.0 wt %, greater than or equal to 1.5 wt %, greater than or equal to 2.0 wt %, greater than or equal to 2.5 wt %, greater than or equal to 3.0 wt %, greater than or equal to 3.5 wt %, greater than or equal to 4.0 wt %, greater than or equal to 4.5 wt %, greater than or equal to 5.0 wt %, greater than or equal to 5.5 wt %, greater than or equal to 6.0 wt %, greater than or equal to 6.5 wt %, greater than or equal to 7.0 wt %, greater than or equal to 7.5 wt %, greater than or equal to 8.0 wt %, greater than or equal to 8.5 wt %, greater than or equal to 9.0 wt %, greater than or equal to 9.5 wt %, greater than or equal to 10.0 wt %, greater than or equal to 10.5 wt %, greater than or equal to 11.0 wt %, greater than or equal to 11.5 wt %, greater than or equal to 12.0 wt %, greater than or equal to 12.5 wt %, greater than or equal to 13.0 wt %, greater than or equal to 13.5 wt %, greater than or equal to 14.0 wt %, or greater than or equal to 14.5 wt %. In embodiments, the glass composition comprises $Li_2O$ in amounts less than or equal to 15.0 wt %, such as less than or equal to 14.5 wt %, less than or equal to 14.0 wt %, less than or equal to 13.5 wt %, less than or equal to 13.0 wt %, less than or equal to 12.5 wt %, less than or equal to 12.0 wt %, less than or equal to 11.5 wt %, less than or equal to 11.0 wt %, less than or equal to 10.5 wt %, less than or equal to 10.0 wt %, less than or equal to 9.5 wt %, less than or equal to 9.0 wt %, less than or equal to 8.5 wt %, less than or equal to 8.0 wt %, less than or equal to 7.5 wt %, less than or equal to 7.0 wt %, less than or equal to 6.5 wt %, less than or equal to 6.0 wt %, less than or equal to 5.5 wt %, less than or equal to 5.0 wt %, less than or equal to 4.5 wt %, less than or equal to 4.0 wt %, less than or equal to 3.5 wt %, less than or equal to 3.0 wt %, less than or equal to 2.5 wt %, less than or equal to 2.0 wt %, less than or equal to 1.5 wt %, or less than or equal to 1.0 wt %. It should be understood that, in embodiments, any of the above ranges may be combined with any other range. In embodiments, the glass composition comprises $Li_2O$ in an amount from greater than 0 wt % to less than or equal to 15.0 wt %, such as from greater than or equal to 0.5 wt % to less than or equal to 14.5 wt %, from greater than or equal to 1.0 wt % to less than or equal to 14.0 wt %, from greater than or equal to 1.5 wt % to less than or equal to 13.5 wt %, from greater than or equal to 2.0 wt % to less than or equal to 13.0 wt %, from greater than or equal to 2.5 wt % to less than or equal to 12.5 wt %, from greater than or equal to 3.0 wt % to less than or equal to 12.0 wt %, from greater than or equal to 3.5 wt % to less than or equal to 11.5 wt %, from greater than or equal to 4.0 wt % to less than or equal to 11.0 wt %, from greater than or equal to 4.5 wt % to less than or equal to 10.5 wt %, from greater than or equal to 5.0 wt % to less than or equal to 10.0 wt %, from greater than or equal to 5.5 wt % to less than or equal to 9.5 wt %, from greater than or equal to 6.0 wt % to less than or equal to 9.0 wt %, from greater than or equal to 6.5 wt % to less than or equal to 8.5 wt %, from greater than or equal to 7.0 wt % to less than or equal to 8.0 wt %, or about 7.5 wt %, and all ranges and sub-ranges between the foregoing values. In some embodiments, the glass composition comprises $Li_2O$ in an amount from greater than or equal to 3.0 wt % to less than or equal to 5.0 wt %.

The glass ceramic may include one or more alkali metal oxides in addition to $Li_2O$. The additional alkali metal oxides further facilitate the chemical strengthening of the glass ceramic, such as through an ion exchange process. The total content of alkali metal oxides (e.g., $Li_2O$, $Na_2O$, and $K_2O$ as well as other alkali metal oxides including $Cs_2O$ and $Rb_2O$) in the glass ceramic may be referred to as "$R_2O$", and $R_2O$ may be expressed in wt %. In some embodiments, the glass ceramic may include a mixture of alkali metal oxides, such as a combination of $Li_2O$ and $Na_2O$, a combination of $Li_2O$ and $K_2O$, or a combination of $Li_2O$, $Na_2O$, and $K_2O$.

The inclusion of a mixture of alkali metal oxides in the glass ceramic results in faster and more efficient ion exchange, such as when exchanging $Na^+$ ions into the glass for $Li^+$ ions.

The glass ceramic may include $Na_2O$ as an additional alkali metal oxide. The $Na_2O$ aids in the ion exchangeability of the glass ceramic, and also decreases the melting point of the precursor glass composition and improves formability of the precursor glass composition. The presence of $Na_2O$ also shortens the length of the necessary ceramming treatment. However, if too much $Na_2O$ is added to the glass composition, the CTE may be too high. The $Na_2O$ may also reduce the viscosity of the residual glass in the glass ceramic, which may reduce the cracks formed in the glass ceramics during the ceramming treatment. In embodiments, the glass composition generally comprises $Na_2O$ in an amount greater than or equal to 0 wt %, such as greater than or equal to 0.5 wt %, greater than or equal to 1.0 wt %, greater than or equal to 1.5 wt %, greater than or equal to 2.0 wt %, greater than or equal to 2.5 wt %, greater than or equal to 3.0 wt %, greater than or equal to 3.5 wt %, greater than or equal to 4.0 wt %, or greater than or equal to 4.5 wt %. In embodiments, the glass composition comprises $Na_2O$ in amounts less than or equal to 5.0 wt %, such as less than or equal to 4.5 wt %, less than or equal to 4.0 wt %, less than or equal to 3.5 wt %, less than or equal to 3.0 wt %, less than or equal to 2.5 wt %, less than or equal to 2.0 wt %, less than or equal to 1.5 wt %, less than or equal to 1.0 wt %, or less than or equal to 0.5 wt %. It should be understood that, in embodiments, any of the above ranges may be combined with any other range. In embodiments, the glass composition comprises $Na_2O$ in an amount from greater than or equal to 0 wt % to less than or equal to 5.0 wt %, such as from greater than or equal to 0.5 wt % to less than or equal to 4.5 wt %, from greater than or equal to 1.0 wt % to less than or equal to 4.0 wt %, from greater than or equal to 1.5 wt % to less than or equal to 3.5 wt %, from greater than or equal to 2.0 wt % to less than or equal to 3.0 wt %, or 2.5 wt %, and all ranges and sub-ranges between the foregoing values. In some embodiments, the glass composition comprises $Na_2O$ in an amount from greater than or equal to 0 wt % to less than or equal to 2.0 wt %.

The glass ceramics of embodiments may further comprise ZnO. The ZnO in the precursor glass supplies the zinc necessary to form the gahnite crystal phase when the precursor glass is cerammed to form a glass ceramic. The ZnO also acts as a flux, lowering the cost of the production of the precursor glass. In embodiments, the glass composition generally comprises ZnO in a concentration of greater than or equal to 0.5 wt %, such as greater than or equal to 1.0 wt %, greater than or equal to 1.5 wt %, greater than or equal to 2.0 wt %, greater than or equal to 2.5 wt %, greater than or equal to 3.0 wt %, or greater than or equal to 3.5 wt %. In embodiments, the glass composition comprises ZnO in amounts less than or equal to 4.0 wt %, such as less than or equal to 3.5 wt %, less than or equal to 3.0 wt %, less than or equal to 2.5 wt %, less than or equal to 2.0 wt %, less than or equal to 1.5 wt %, or less than or equal to 1.0 wt %. It should be understood that, in embodiments, any of the above ranges may be combined with any other range. In embodiments, the glass composition comprises ZnO in an amount from greater than or equal to 0.5 wt % to less than or equal to 4.0 wt %, such as from greater than or equal to 1.0 wt % to less than or equal to 3.5 wt %, from greater than or equal to 1.5 wt % to less than or equal to 3.0 wt %, or from greater than or equal to 2.0 wt % to less than or equal to 2.5 wt %, and all ranges and sub-ranges between the foregoing values.

The glass ceramics of embodiments may further comprise MgO. The presence of MgO in the glass may increase the elastic modulus. The MgO also acts as a flux, lowering the cost of the production of the precursor glass. In embodiments, the amount of MgO in the glass ceramic is greater than or equal to 0.5 wt %, such as greater than or equal to 1.0 wt %, greater than or equal to 1.5 wt %, greater than or equal to 2.0 wt %, or greater than or equal to 2.5 wt %. In embodiments, the amount of MgO in the glass ceramic is less than or equal to 3.0 wt %, such as less than or equal to 2.5 wt %, less than or equal to 2.0 wt %, less than or equal to 1.5 wt %, or less than or equal to 1.0 wt %. It should be understood that, in embodiments, any of the above ranges may be combined with any other range. In embodiments, the amount of MgO in the glass ceramic is greater than or equal to 0.5 wt % to less than or equal to 3.0 wt %, such as greater than or equal to 1.0 wt % to less than or equal to 2.5 wt %, or greater than or equal to 1.5 wt % to less than or equal to 2.0 wt %, and all ranges and sub-ranges between the foregoing values.

The glass ceramics of embodiments may further comprise nucleating agents. The nucleating agent may be $TiO_2$. In embodiments, the glass may include $TiO_2$ in an amount greater than or equal to 2.0 wt %, such as greater than or equal to 2.5 wt %, greater than or equal to 3.0 wt %, greater than or equal to 3.5 wt %, greater than or equal to 4.0 wt %, greater than or equal to 4.5 wt %, greater than or equal to 5.0 wt %, or greater than or equal to 5.5 wt %. In embodiments, the glass may include $TiO_2$ in an amount less than or equal to 6.0 wt %, such as less than or equal to 5.5 wt %, less than or equal to 5.0 wt %, less than or equal to 4.5 wt %, less than or equal to 4.0 wt %, less than or equal to 3.5 wt %, less than or equal to 3.0 wt %, or less than or equal to 2.5 wt %. It should be understood that, in embodiments, any of the above ranges may be combined with any other range. In embodiments, the glass may include $TiO_2$ in an amount from greater than or equal to 2.0 wt % to less than or equal to 6.0 wt %, such as an amount from greater than or equal to 2.5 wt % to less than or equal to 5.5 wt %, from greater than or equal to 3.0 wt % to less than or equal to 5.0 wt %, from greater than or equal to 3.5 wt % to less than or equal to 4.5 wt %, or 4.0 wt %, and all ranges and sub-ranges between the foregoing values.

In embodiments, the glass ceramic may optionally include one or more fining agents. In some embodiments, the fining agents may include, for example, $SnO_2$ and/or $As_2O_3$. In embodiments, $SnO_2$ may be present in the glass composition in an amount less than or equal to 1.0 wt %, such as from greater than or equal to 0.1 wt % to less than or equal to 1.0 wt %, greater than or equal to 0.2 wt % to less than or equal to 0.9 wt %, greater than or equal to 0.3 wt % to less than or equal to 0.8 wt %, greater than or equal to 0.4 wt % to less than or equal to 0.7 wt %, or greater than or equal to 0.5 wt % to less than or equal to 0.6 wt %, and all ranges and sub-ranges between the foregoing values. In embodiments, the glass ceramic may be free or substantially free of one or both of arsenic and antimony.

The glass ceramic includes colorants to produce the desired black color and opacity. The glass ceramic includes a mixture of $Fe_2O_3$ and $Co_3O_4$, which allows the achievement of the desired color space with a reduced $Fe_2O_3$ content. The reduced $Fe_2O_3$ content allows for easier manufacturing of the glass compositions. In some embodiments, additional colorants, such as $V_2O_5$, $Cr_2O_3$, $MnO_2$, and/or CuO, may be included in the glass ceramic and may produce different hues.

In embodiments, the glass includes $Fe_2O_3$ in an amount greater than 0 wt %, such as greater than or equal to 0.1 wt %, greater than or equal to 0.2 wt %, greater than or equal to 0.3 wt %, greater than or equal to 0.4 wt %, greater than or equal to 0.5 wt %, greater than or equal to 0.6 wt %, greater than or equal to 0.7 wt %, greater than or equal to 0.8 wt %, greater than or equal to 0.9 wt %, greater than or equal to 1.0 wt %, greater than or equal to 1.1 wt %, greater than or equal to 1.2 wt %, greater than or equal to 1.3 wt %, greater than or equal to 1.4 wt %, greater than or equal to 1.5 wt %, greater than or equal to 1.6 wt %, greater than or equal to 1.7 wt %, greater than or equal to 1.8 wt %, greater than or equal to 1.9 wt %, greater than or equal to 2.0 wt %, greater than or equal to 2.1 wt %, greater than or equal to 2.2 wt %, greater than or equal to 2.3 wt %, greater than or equal to 2.4 wt %, greater than or equal to 2.5 wt %, greater than or equal to 2.6 wt %, greater than or equal to 2.7 wt %, greater than or equal to 2.8 wt %, or greater than or equal to 2.9 wt %. In embodiments, the glass includes $Fe_2O_3$ in an amount of less than or equal to 3.0 wt %, such as less than or equal to 2.9 wt %, less than or equal to 2.8 wt %, less than or equal to 2.7 wt %, less than or equal to 2.6 wt %, less than or equal to 2.5 wt %, less than or equal to 2.4 wt %, less than or equal to 2.3 wt %, less than or equal to 2.2 wt %, less than or equal to 2.1 wt %, less than or equal to 2.0 wt %, less than or equal to 1.9 wt %, less than or equal to 1.8 wt %, less than or equal to 1.7 wt %, less than or equal to 1.6 wt %, less than or equal to 1.5 wt %, less than or equal to 1.4 wt %, less than or equal to 1.3 wt %, less than or equal to 1.2 wt %, less than or equal to 1.1 wt %, less than or equal to 1.0 wt %, less than or equal to 0.9 wt %, less than or equal to 0.8 wt %, less than or equal to 0.7 wt %, less than or equal to 0.6 wt %, less than or equal to 0.5 wt %, less than or equal to 0.4 wt %, less than or equal to 0.3 wt %, less than or equal to 0.2 wt %, or less than or equal to 0.1 wt %. It should be understood that, in embodiments, any of the above ranges may be combined with any other range. In embodiments, the glass may include $Fe_2O_3$ in an amount from greater than 0 wt % to less than or equal to 3.0 wt %, such as an amount from greater than or equal to 0.1 wt % to less than or equal to 2.9 wt %, from greater than or equal to 0.2 wt % to less than or equal to 2.8 wt %, from greater than or equal to 0.3 wt % to less than or equal to 2.7 wt %, from greater than or equal to 0.4 wt % to less than or equal to 2.6 wt %, from greater than or equal to 0.5 wt % to less than or equal to 2.5 wt %, from greater than or equal to 0.6 wt % to less than or equal to 2.4 wt %, from greater than or equal to 0.7 wt % to less than or equal to 2.3 wt %, from greater than or equal to 0.8 wt % to less than or equal to 2.2 wt %, from greater than or equal to 0.9 wt % to less than or equal to 2.1 wt %, from greater than or equal to 1.0 wt % to less than or equal to 2.0 wt %, from greater than or equal to 1.1 wt % to less than or equal to 1.9 wt %, from greater than or equal to 1.2 wt % to less than or equal to 1.8 wt %, from greater than or equal to 1.3 wt % to less than or equal to 1.7 wt %, from greater than or equal to 1.4 wt % to less than or equal to 1.6 wt %, or 1.5 wt %, and all ranges and sub-ranges between the foregoing values. In other embodiments, the glass may include $Fe_2O_3$ in an amount from greater than or equal to 0.2 wt % to less than or equal to 3.0 wt % or from greater than 0 wt % to less than or equal to 1.5 wt %.

In some embodiments, the glass includes $Co_3O_4$ in an amount greater than or equal to 0.1 wt %, such as greater than or equal to 0.2 wt %, greater than or equal to 0.3 wt %, greater than or equal to 0.4 wt %, greater than or equal to 0.5 wt %, greater than or equal to 0.6 wt %, greater than or equal to 0.7 wt %, greater than or equal to 0.8 wt %, greater than or equal to 0.9 wt %, greater than or equal to 1.0 wt %, greater than or equal to 1.1 wt %, greater than or equal to 1.2 wt %, greater than or equal to 1.3 wt %, greater than or equal to 1.4 wt %, greater than or equal to 1.5 wt %, greater than or equal to 1.6 wt %, greater than or equal to 1.7 wt %, greater than or equal to 1.8 wt %, or greater than or equal to 1.9 wt %. In embodiments, the glass includes $Co_3O_4$ in an amount of less than or equal to 2.0 wt %, such as less than or equal to 1.9 wt %, less than or equal to 1.8 wt %, less than or equal to 1.7 wt %, less than or equal to 1.6 wt %, less than or equal to 1.5 wt %, less than or equal to 1.4 wt %, less than or equal to 1.3 wt %, less than or equal to 1.2 wt %, less than or equal to 1.1 wt %, less than or equal to 1.0 wt %, less than or equal to 0.9 wt %, less than or equal to 0.8 wt %, less than or equal to 0.7 wt %, less than or equal to 0.6 wt %, less than or equal to 0.5 wt %, less than or equal to 0.4 wt %, less than or equal to 0.3 wt %, or less than or equal to 0.1 wt %. It should be understood that, in embodiments, any of the above ranges may be combined with any other range. In embodiments, the glass may include $Co_3O_4$ in an amount from greater than or equal to 0.1 wt % to less than or equal to 2.0 wt %, such as an amount from greater than or equal to 0.2 wt % to less than or equal to 1.9 wt %, from greater than or equal to 0.3 wt % to less than or equal to 1.8 wt %, from greater than or equal to 0.4 wt % to less than or equal to 1.7 wt %, from greater than or equal to 0.5 wt % to less than or equal to 1.6 wt %, from greater than or equal to 0.6 wt % to less than or equal to 1.5 wt %, from greater than or equal to 0.7 wt % to less than or equal to 1.4 wt %, from greater than or equal to 0.8 wt % to less than or equal to 1.3 wt %, from greater than or equal to 0.9 wt % to less than or equal to 1.2 wt %, or from greater than or equal to 1.0 wt % to less than or equal to 1.1 wt %, and all ranges and sub-ranges between the foregoing values.

From the above, glass ceramics according to embodiments may be formed from precursor glass articles formed by any suitable method, such as slot forming, float forming, rolling processes, fusion forming processes, etc.

A precursor glass article may be characterized by the manner in which it is formed. For instance, where the precursor glass article may be characterized as float-formable (i.e., formed by a float process), down-drawable and, in particular, fusion-formable or slot-drawable (i.e., formed by a down draw process such as a fusion draw process or a slot draw process).

Some embodiments of the precursor glass articles described herein may be formed by a down-draw process. Down-draw processes produce glass articles having a uniform thickness that possess relatively pristine surfaces. Because the average flexural strength of the glass article is controlled by the amount and size of surface flaws, a pristine surface that has had minimal contact has a higher initial strength. In addition, down drawn glass articles have a very flat, smooth surface that can be used in its final application without costly grinding and polishing.

Some embodiments of the precursor glass articles may be described as fusion-formable (i.e., formable using a fusion draw process). The fusion process uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass article. The fusion draw method offers the advantage that, because the two glass films flowing over the channel fuse together, neither of the outside surfaces of the resulting glass article comes in contact with any part of the apparatus. Thus, the surface properties of the fusion drawn glass article are not affected by such contact.

Some embodiments of the precursor glass articles described herein may be formed by a slot draw process. The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass article and into an annealing region.

The glass ceramics may be formed by ceramming a precursor glass under any suitable conditions. The ceramming cycle includes a nucleation step and a growth step. The growth step is carried out at temperatures higher than the temperature of a first crystallization peak of the precursor glass. This allows the production of glass ceramics where β-spodumene is the only primary crystal phase.

In embodiments, the growth step (or ceramming step) occurs at temperatures of greater than or equal to 900° C., such as greater than or equal to 925° C., greater than or equal to 950° C., or greater than or equal to 975° C. In embodiments, the growth step occurs at temperatures of from greater than or equal to 900° C. to less than or equal to 1100° C., such as greater than or equal to 925° C. to less than or equal to 1050° C., or greater than or equal to 950° C. to less than or equal to 1000° C., and all ranges and sub-ranges between the foregoing values.

In embodiments, the growth step extends for a time period of greater than or equal to 15 minutes, such as greater than or equal to 30 minutes, greater than or equal to 45 minutes, greater than or equal to 1.0 hour, greater than or equal to 1.5 hours, greater than or equal to 2.0 hours, greater than or equal to 2.5 hours, greater than or equal to 3.0 hours, greater than or equal to 3.5 hours, greater than or equal to 4.0 hours, greater than or equal to 4.5 hours, greater than or equal to 5.0 hours, greater than or equal to 5.5 hours, greater than or equal to 6.0 hours, greater than or equal to 6.5 hours, greater than or equal to 7.0 hours, greater than or equal to 7.5 hours, greater than or equal to 8.0 hours, greater than or equal to 8.5 hours, greater than or equal to 9.0 hours, greater than or equal to 9.5 hours, greater than or equal to 10.0 hours, greater than or equal to 10.5 hours, greater than or equal to 11.0 hours greater than or equal to 11.5 hours, greater than or equal to 12.0 hours, greater than or equal to 12.5 hours, greater than or equal to 13.0 hours, greater than or equal to 13.5 hours, greater than or equal to 14.0 hours, greater than or equal to 14.5 hours, greater than or equal to 15.0 hours, or greater than or equal to 15.5 hours. In embodiments, the growth step extends for a time period from greater than or equal to 15 minutes to less than or equal to 16.0 hours, such as greater than or equal to 30 minutes to less than or equal to 15.5 hours, greater than or equal to 45 minutes to less than or equal to 15.0 hours, greater than or equal to 1.0 hour to less than or equal to 14.5 hours, greater than or equal to 1.5 hours to less than or equal to 14.0 hours, greater than or equal to 2.0 hours to less than or equal to 13.5 hours, greater than or equal to 2.5 hours to less than or equal to 13.0 hours, greater than or equal to 3.0 hours to less than or equal to 12.5 hours, greater than or equal to 3.5 hours to less than or equal to 12.0 hours, greater than or equal to 4.0 hours to less than or equal to 11.5 hours, greater than or equal to 4.5 hours to less than or equal to 11.0 hours, greater than or equal to 5.0 hours to less than or equal to 10.5 hours, greater than or equal to 5.5 hours to less than or equal to 10.0 hours, greater than or equal to 6.0 hours to less than or equal to 9.5 hours, greater than or equal to 6.5 hours to less than or equal to 9.0 hours, greater than or equal to 7.0 hours to less than or equal to 8.5 hours, or greater than or equal to 7.5 hours to less than or equal to 8.0 hours, and all ranges and sub-ranges between the foregoing values.

In embodiments, the nucleation step occurs at temperatures of greater than or equal to 725° C., such as greater than or equal to 750° C., greater than or equal to 775° C., greater than or equal to 800° C., or greater than or equal to 825° C. In embodiments, the nucleation step occurs at temperatures of from greater than or equal to 725° C. to less than or equal to 850° C., such as greater than or equal to 750° C. to less than or equal to 825° C., or greater than or equal to 775° C. to less than or equal to 800° C., and all ranges and sub-ranges between the foregoing values.

In embodiments, the nucleation step extends for a time period of greater than or equal to 30 minutes, such as greater than or equal to 1.0 hour, greater than or equal to 1.5 hours, greater than or equal to 2.0 hours, greater than or equal to 2.5 hours, greater than or equal to 3.0 hours, greater than or equal to 3.5 hours, greater than or equal to 4.0 hours, greater than or equal to 4.5 hours, greater than or equal to 5.0 hours, or greater than or equal to 5.5 hours. In embodiments, the nucleation step extends for a time period from greater than or equal to 30 minutes to less than or equal to 6.0 hours, such as greater than or equal to 1.0 hour to less than or equal to 5.5 hours, greater than or equal to 1.5 hours to less than or equal to 5.0 hours, greater than or equal to 2.0 hours to less than or equal to 4.5 hours, greater than or equal to 2.5 hours to less than or equal to 4.0 hours, or greater than or equal to 3.0 hours to less than or equal to 3.5 hours, and all ranges and sub-ranges between the foregoing values.

In embodiments, the glass ceramics are also chemically strengthened, such as by ion exchange, making a glass ceramic that is damage resistant for applications such as, but not limited to, housings for consumer electronics. With reference to FIG. 1, the glass ceramic 100 has a first region under compressive stress (e.g., first and second compressive layers 120, 122 in FIG. 1) extending from the surface to a depth of compression (DOC) of the glass ceramic and a second region (e.g., central region 130 in FIG. 1) under a tensile stress or central tension (CT) extending from the DOC into the central or interior region of the glass ceramic. As used herein, DOC refers to the depth at which the stress within the glass ceramic changes from compressive to tensile. At the DOC, the stress crosses from a positive (compressive) stress to a negative (tensile) stress and thus exhibits a stress value of zero.

According to the convention normally used in the art, compression or compressive stress is expressed as a negative (<0) stress and tension or tensile stress is expressed as a positive (>0) stress. Throughout this description, however, CS is expressed as a positive or absolute value—i.e., as recited herein, CS=|CS|. The compressive stress (CS) may have a maximum at the surface of the glass, and the CS may vary with distance d from the surface according to a function. Referring again to FIG. 1, a first compressive layer 120 extends from first surface 110 to a depth $d_1$ and a second compressive layer 122 extends from second surface 112 to a depth $d_2$. Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

The compressive stress of both compressive stress regions (120, 122 in FIG. 1) is balanced by stored tension in the central region (130) of the glass ceramic. The maximum central tension (CT) and DOC values are measured using a scattered light polariscope (SCALP) technique known in the art.

Compressive stress layers may be formed in the glass ceramic by exposing the glass to an ion exchange solution. In embodiments, the ion exchange solution may contain one or more molten nitrate salts. In embodiments, the ion exchange solution may contain molten $KNO_3$, molten $NaNO_3$, or combinations thereof. In certain embodiments, the ion exchange solution may comprise less than or equal to 80% molten $KNO_3$, less than or equal to 75% molten $KNO_3$, less than or equal to 70% molten $KNO_3$, less than or equal to 65% molten $KNO_3$, or less than or equal to 60% molten $KNO_3$. In certain embodiments, the ion exchange solution may comprise greater than or equal to 20% molten $NaNO_3$, greater than or equal to 25% molten $NaNO_3$, greater than or equal to 30% molten $NaNO_3$, greater than or equal to 35% molten $NaNO_3$, or greater than or equal to 40% molten $NaNO_3$. In other embodiments, the ion exchange solution may comprise about 80% molten $KNO_3$ and about 20% molten $NaNO_3$, about 75% molten $KNO_3$ and about 25% molten $NaNO_3$, about 70% molten $KNO_3$ and about 30% molten $NaNO_3$, about 65% molten $KNO_3$ and about 35% molten $NaNO_3$, or about 60% molten $KNO_3$ and about 40% molten $NaNO_3$, and all ranges and sub-ranges between the foregoing values. In embodiments, other sodium and potassium salts may be used in the ion exchange solution, such as, for example sodium or potassium nitrites, phosphates, or sulfates.

The glass ceramic may be exposed to the ion exchange solution by dipping the glass ceramic into a bath of the ion exchange solution, spraying the ion exchange solution onto the glass ceramic, or otherwise physically applying the ion exchange solution to the glass ceramic. Upon exposure to the glass ceramic, the ion exchange solution may, according to embodiments, be at a temperature from greater than or equal to 400° C. to less than or equal to 500° C., such as from greater than or equal to 410° C. to less than or equal to 490° C., from greater than or equal to 420° C. to less than or equal to 480° C., from greater than or equal to 430° C. to less than or equal to 470° C., or from greater than or equal to 440° C. to less than or equal to 460° C., and all ranges and sub-ranges between the foregoing values. In embodiments, the glass ceramic may be exposed to the ion exchange solution for a duration from greater than or equal to 4 hours to less than or equal to 48 hours, such as from greater than or equal to 8 hours to less than or equal to 44 hours, from greater than or equal to 12 hours to less than or equal to 40 hours, from greater than or equal to 16 hours to less than or equal to 36 hours, from greater than or equal to 20 hours to less than or equal to 32 hours, or from greater than or equal to 24 hours to less than or equal to 28 hours, and all ranges and sub-ranges between the foregoing values.

The ion exchange process may be performed in an ion exchange solution under processing conditions that provide an improved compressive stress profile as disclosed, for example, in U.S. Patent Application Publication No. 2016/0102011, which is incorporated herein by reference in its entirety.

After an ion exchange process is performed, it should be understood that a composition at the surface of the glass ceramic may be different than the composition of the as-formed glass ceramic (i.e., the glass ceramic before it undergoes an ion exchange process). This results from one type of alkali metal ion in the as-formed glass ceramic, such as, for example $Li^+$ or $Na^+$, being replaced during the ion exchange process with larger alkali metal ions, such as, for example $Na^+$ or $K^+$, respectively. However, the composition at or near the center of the depth of the ion exchanged glass ceramic will, in embodiments, still have the composition of the as-formed glass ceramic.

In some embodiments, the glass ceramics may exhibit minimal or no change in color after ion exchange treatment. The absolute value of the change in the b* value of the glass ceramic due to ion exchange may be less than or equal to 1.5, such as less than or equal to 1.4, less than or equal to 1.3, less than or equal to 1.2, less than or equal to 1.1, less than or equal to 1.0, less than or equal to 0.9, less than or equal to 0.8, less than or equal to 0.7, less than or equal to 0.6, less than or equal to 0.5, less than or equal to 0.4, less than or equal to 0.3, less than or equal to 0.1, or less. The absolute value of the change in the L* value of the glass ceramic due to ion exchange may be less than or equal to 0.5, such as less than or equal to 0.4, less than or equal to 0.3, less than or equal to 0.1, or less. The minimal change in color of the glass ceramic due to ion exchange allows for improved color accuracy, and ensures a uniform appearance in applications where portions of the glass ceramic are subjected to different ion exchange treatments.

Figure 2A:
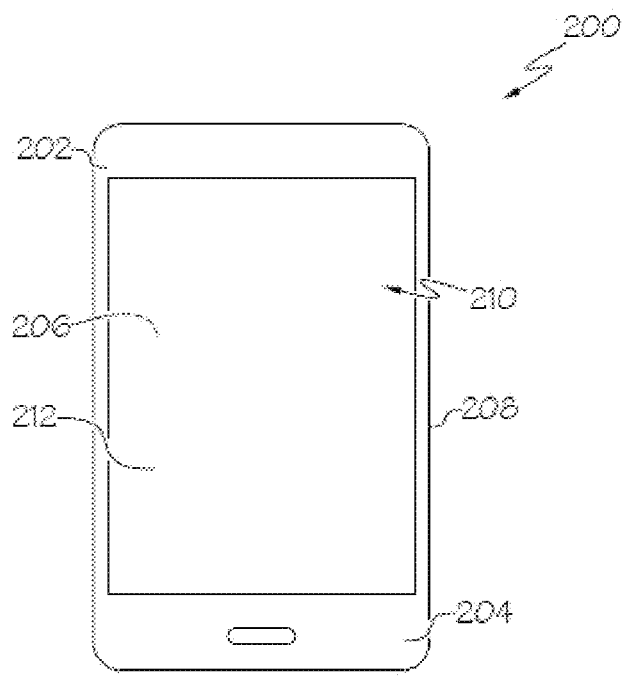
FIG. 2A is a plan view of an exemplary electronic device incorporating any of the glass ceramics disclosed herein.
Figure 2B:
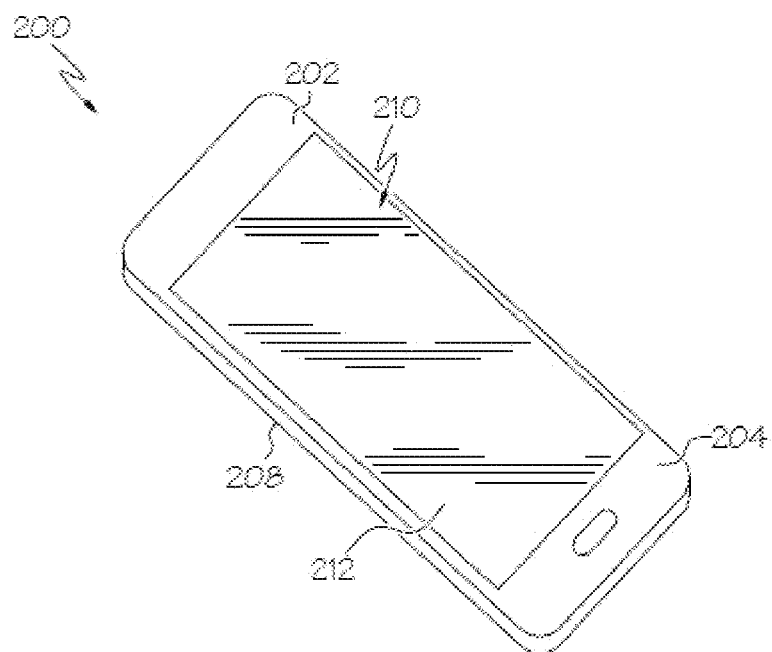
FIG. 2B is a perspective view of the exemplary electronic device of FIG. 2A.

The glass ceramic articles disclosed herein may be incorporated into another article such as an article with a display (or display articles) (e.g., consumer electronics, including mobile phones, tablets, computers, navigation systems, and the like), architectural articles, transportation articles (e.g., automobiles, trains, aircraft, sea craft, etc.), appliance articles, or any article that requires some scratch-resistance, abrasion resistance or a combination thereof. An exemplary article incorporating any of the glass ceramic articles disclosed herein is shown in FIGS. 2A and 2B. Specifically, FIGS. 2A and 2B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover substrate 212 at or over the front surface of the housing such that it is over the display. In some embodiments, at least a portion of the housing 202 may include any of the glass articles disclosed herein.

EXAMPLES

Embodiments will be further clarified by the following examples. It should be understood that these examples are not limiting to the embodiments described above.

Figure 6:
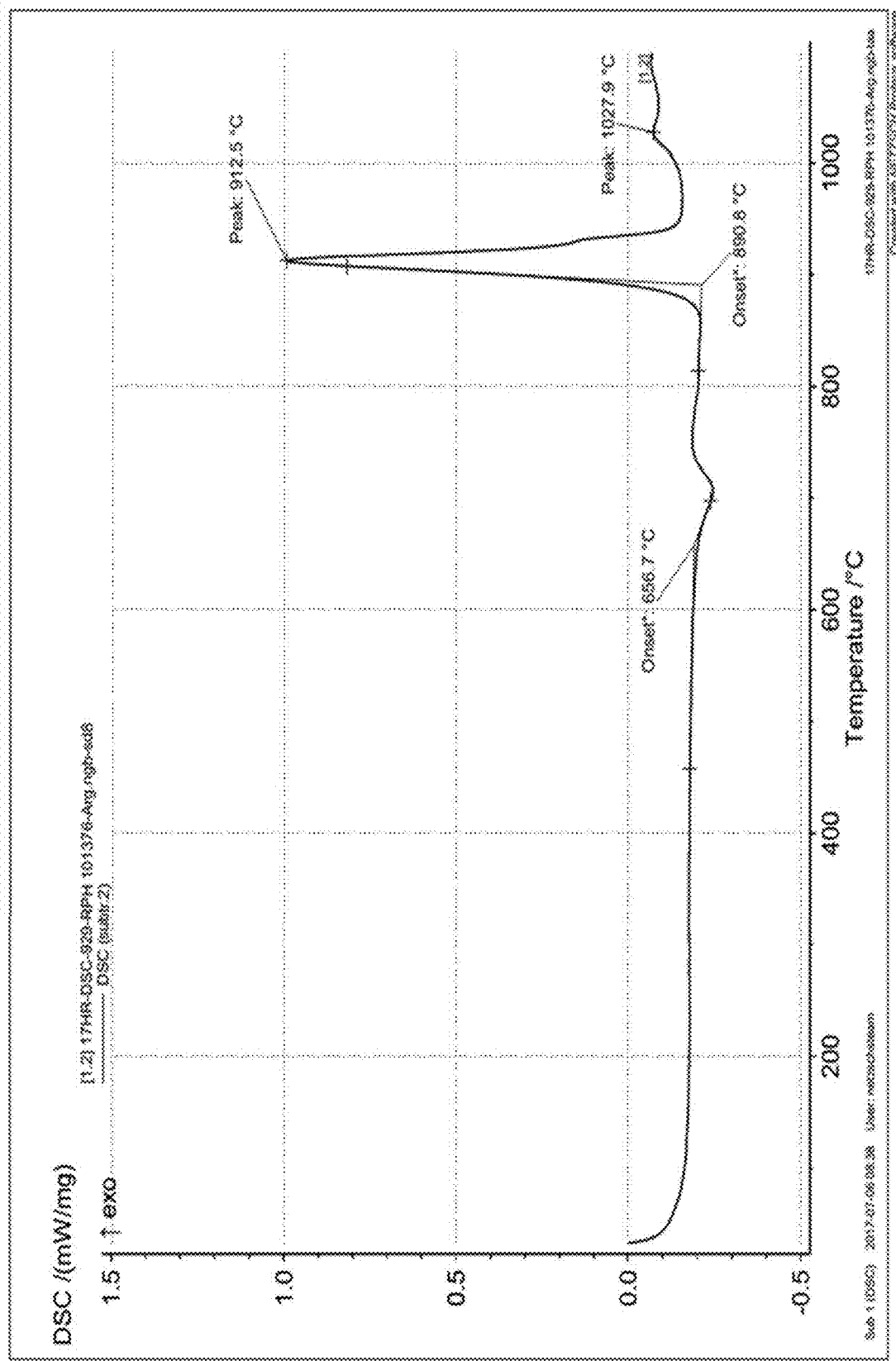
FIG. 6 is a plot of a high temperature differential scanning thermo gram of a glass composition from 30° C. to 1,100° C.

Glass ceramics having components, in wt %, listed in Table 1 below were prepared and ceramed according to the indicated ceramming cycles. The ceramming cycles included a ramp rate of 5° C./minute from room temperature to the nucleation temperature. In Table 1, the nucleation temperature is listed as a temperature and hold time in the first line of the ceramming cycle entry, with the second line of the ceramming cycle entry indicating the growth step temperature and hold time.

atmosphere, producing the thermo gram shown in FIG. 6. As shown in FIG. 6, the glass exhibited a first crystallization peak at about 913° C., and a second crystallization peak at

TABLE 1

|  | Comp. Ex. 1 | Comp. Ex. 2 | Ex. 1 | Ex. 2 | Ex. 3 |
|---|---|---|---|---|---|
| $SiO_2$ | 64.07 | 64.80 | 65.90 | 66.50 | 65.30 |
| $Al_2O_3$ | 21.22 | 19.50 | 19.50 | 19.50 | 19.60 |
| $Li_2O$ | 3.60 | 3.90 | 3.90 | 3.90 | 4.40 |
| $Na_2O$ | 0.37 | 0.40 | 0.40 | 0.40 | 0.40 |
| MgO | 1.67 | 1.80 | 1.80 | 1.80 | 1.80 |
| ZnO | 1.28 | 2.20 | 2.20 | 2.20 | 2.20 |
| $TiO_2$ | 4.76 | 4.30 | 3.10 | 2.50 | 3.10 |
| $SnO_2$ | 0.39 | 0.50 | 0.50 | 0.50 | 0.50 |
| $Fe_2O_3$ | 2.63 | 2.70 | 2.70 | 2.70 | 2.70 |
| $Co_3O_4$ | 0.00 | 0.00 | 0.50 | 0.50 | 0.50 |
| Ceramming cycle | 780° C./2 hr 975° C./4 hr | 835° C./2 hr 975° C./0.5 hr | 780° C./2 hr 975° C./4 hr | 780° C./2 hr 975° C./4 hr | 780° C./2 hr 975° C./4 hr |
| Phase assemblage | β-spodumene, gahnite, pseudobrookite | β-spodumene, gahnite, pseudobrookite | β-spodumene, gahnite, pseudobrookite | β-spodumene, gahnite, pseudobrookite | β-spodumene, gahnite, pseudobrookite |
| Appearance | Black | Black | Gray-Black | Gray-Black | Gray-Black |
| Color coordinates | $L^* = 27.23$ $a^* = -0.11$ $b^* = -2.34$ | $L^* = 27.23$ $a^* = -0.12$ $b^* = -1.29$ |  |  | $L^* = 28.43$ $a^* = -0.22$ $b^* = -2.43$ |

|  | Ex. 4 | Ex. 5 | Ex. 6 | Ex. 7 | Ex. 8 |
|---|---|---|---|---|---|
| $SiO_2$ | 65.60 | 66.00 | 66.20 | 65.30 | 65.80 |
| $Al_2O_3$ | 19.50 | 19.60 | 19.70 | 19.50 | 19.60 |
| $Li_2O$ | 3.90 | 3.90 | 4.00 | 3.90 | 3.90 |
| $Na_2O$ | 0.40 | 0.40 | 0.40 | 0.40 | 0.40 |
| MgO | 1.80 | 1.80 | 1.80 | 1.80 | 1.80 |
| ZnO | 2.20 | 2.20 | 2.20 | 2.20 | 2.20 |
| $TiO_2$ | 4.40 | 4.40 | 4.40 | 4.30 | 4.40 |
| $SnO_2$ | 0.50 | 0.50 | 0.50 | 0.50 | 0.50 |
| $Fe_2O_3$ | 1.10 | 0.80 | 0.40 | 1.10 | 1.10 |
| $Co_3O_4$ | 0.50 | 0.50 | 0.50 | 0.50 | 0.20 |
| Ceramming cycle | 835° C./2 hr 975° C./0.5 hr | 835° C./2 hr 975° C./0.5 hr | 835° C./2 hr 975° C./0.5 hr | 835° C./2 hr 975° C./0.5 hr | 835° C./2 hr 975° C./0.5 hr |
| Phase assemblage | β-spodumene, gahnite, armalcolite | β-spodumene, gahnite, armalcolite | β-spodumene, gahnite, armalcolite | β-spodumene, β-quartz, gahnite, armalcolite | β-spodumene, gahnite, armalcolite |
| Appearance | Black | Black | Black | Black | Black |
| Color coordinates | $L^* = 26.78$ $a^* = -0.05$ $b^* = -2.28$ | $L^* = 26.5$ $a^* = -0.1$ $b^* = -1.79$ | $L^* = 26.69$ $a^* = -0.19$ $b^* = -2.28$ | $L^* = 27.74$ $a^* = -0.21$ $b^* = -1.43$ | $L^* = 26.58$ $a^* = -0.04$ $b^* = -1.95$ |

The phase assemblage of the glass ceramics was determined using X-ray diffraction (XRD) analysis of the cerammed samples. The appearance of the glass ceramics is an impression based on observation of the samples. The color coordinates were measured using an X-rite Ci7 F02 illuminant under SCI UVC conditions.

Figure 3:
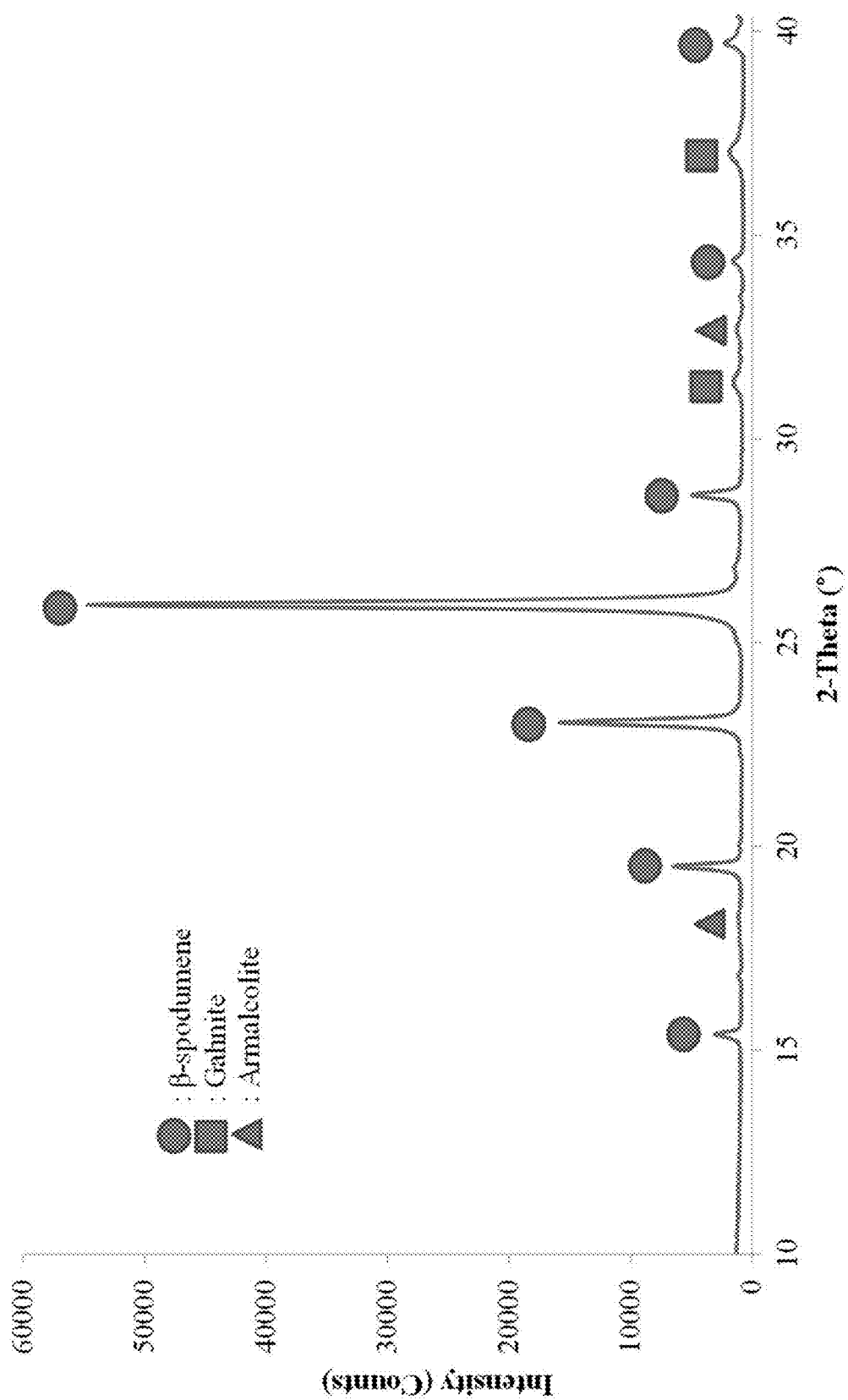
FIG. 3 is an X-ray diffraction spectral plot of a glass ceramic according to an embodiment.
Figure 4:
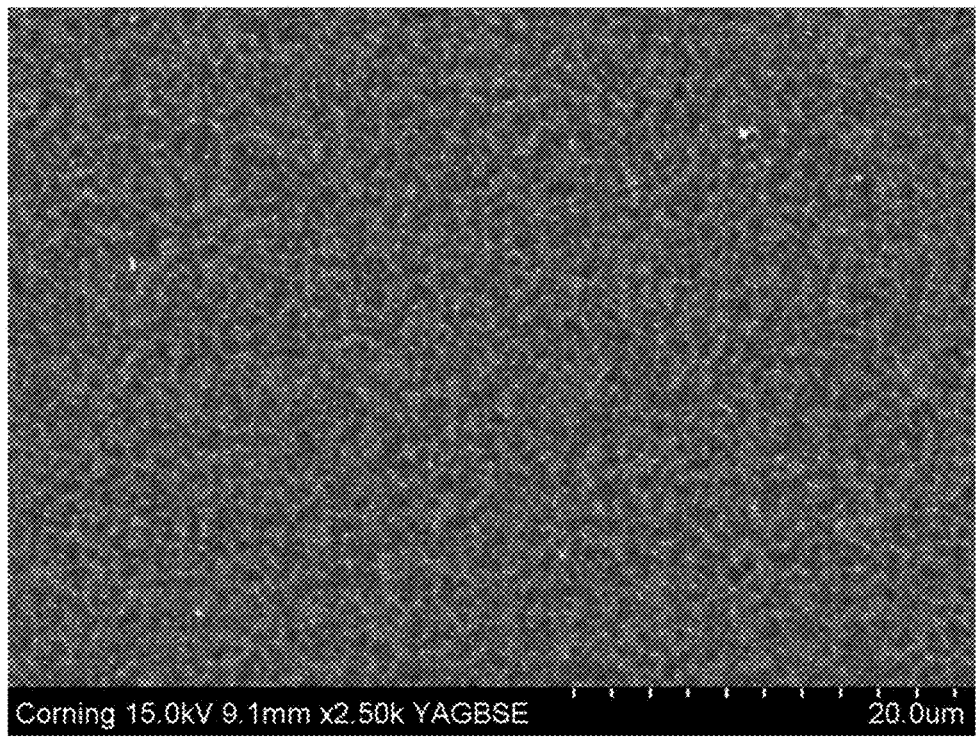
FIG. 4 is a scanning electron microscopy (SEM) image at a first magnification of a glass ceramic according to an embodiment.
Figure 5:
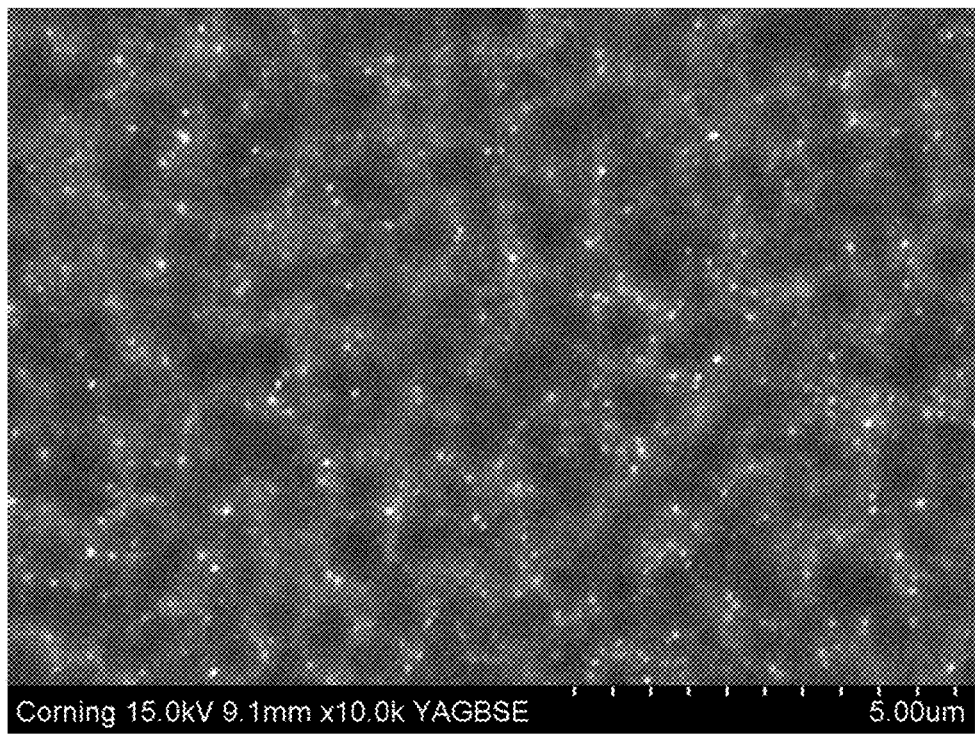
FIG. 5 is a scanning electron microscopy (SEM) image at a second magnification of the glass ceramic of FIG. 5.

A sample having the same composition as Example 4 in Table 1 was cerammed using a nucleation step of 835° C. for 2 hours and a growth step of 975° C. for 0.5 hours. The resulting sample was subjected to XRD analysis, and the spectrum shown in FIG. 3 was produced. The peaks of the XRD spectrum indicated that the glass ceramic included β-spodumene, gahnite, and armalcolite, as shown in FIG. 3. The scanning electron microscope (SEM) images shown in FIGS. 4 and 5 of the sample, at different magnifications, analyzed in FIG. 3 were prepared by polishing cross-sections of the sample, etching the polished samples for 30 seconds with hydrofluoric acid, and then evaporating a conductive carbon coating on the surface of the samples to reduce charging.

A glass having the same composition as Comparative Example 2 in Table 1 was subjected to high temperature differential scanning calorimetry analysis from 30° C. to 1100° C. at a ramp rate of 10° C./minute in an Argon atmosphere, producing the thermo gram shown in FIG. 6. As shown in FIG. 6, the glass exhibited a first crystallization peak at about 913° C., and a second crystallization peak at about 1028° C. The second crystallization peak is associated with β-spodumene, indicating that the growth temperature should be above the temperature of the first crystallization peak to produce the desired β-spodumene primary phase in the glass ceramic.

Samples having the same composition as Example 4 in Table 1 were prepared, and the color coordinates of the samples were measured as described above. The samples were cerammed according to the ceramming cycles in Table 2 below. Sample A was the as-formed precursor glass, without an additional ceramming treatment. Sample B was subjected only to a nucleation step, without a subsequent growth step.

TABLE 2

|  | Ceramming Cycle |
|---|---|
| A | None |
| B | 835° C./2 hr |
| C | 835° C./2 hr 900° C./0.5 hr |
| D | 835° C./2 hr 925° C./0.5 hr |
| E | 835° C./2 hr |

TABLE 2-continued

| | Ceramming Cycle |
|---|---|
| F | 950° C./0.5 hr<br>836° C./2 hr |
| G | 975° C./0.5 hr<br>837° C./2 hr<br>1000° C./0.5 hr |

Figure 7:
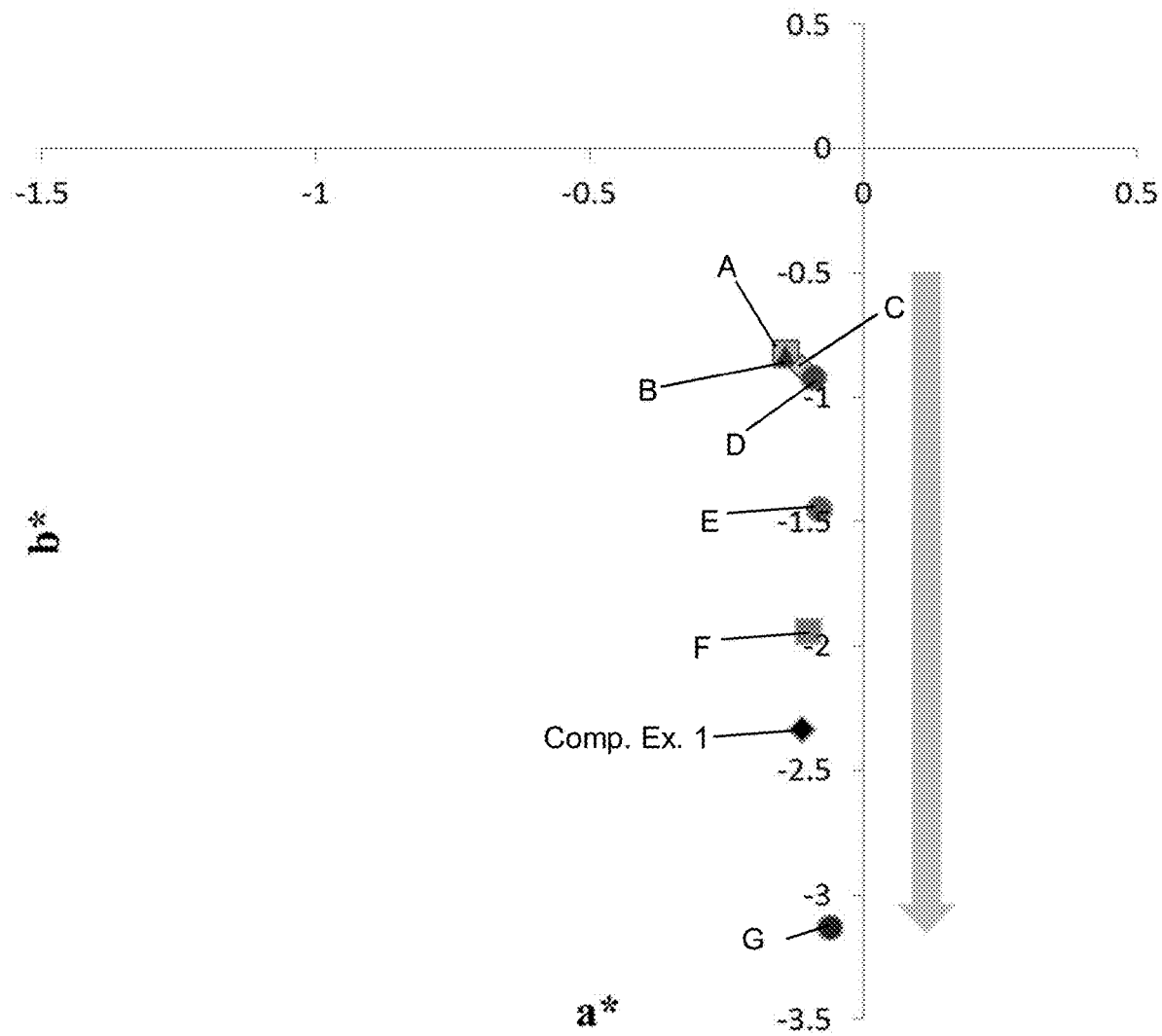
FIG. 7 is a plot of the a* and b* color coordinates for a precursor glass composition, a comparative glass ceramic, and glass ceramics according to an embodiment produced with various ceramming cycles.
Figure 8:
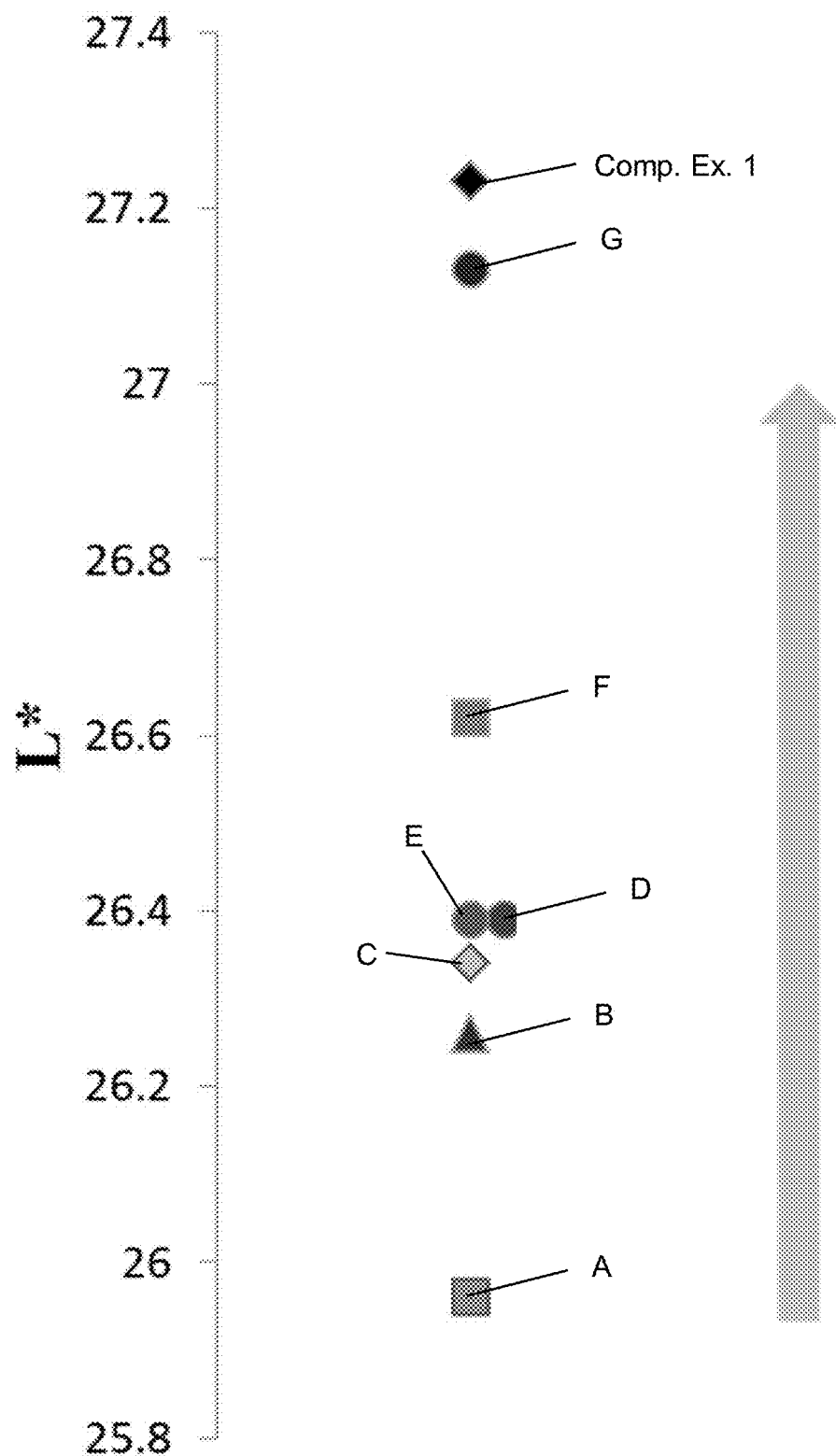
FIG. 8 is a plot of the L* color coordinate for the precursor glass composition, the comparative glass ceramic, and the glass ceramics according to an embodiment produced with various ceramming cycles of FIG. 7.

The color coordinates of a sample of Comparative Example 1 of Table 1 was also measured. All of the measured samples had a thickness of 0.8 mm. The measured a* and b* values are shown in FIG. 7, and the measured L* values are shown in FIG. 8.

Figure 9:
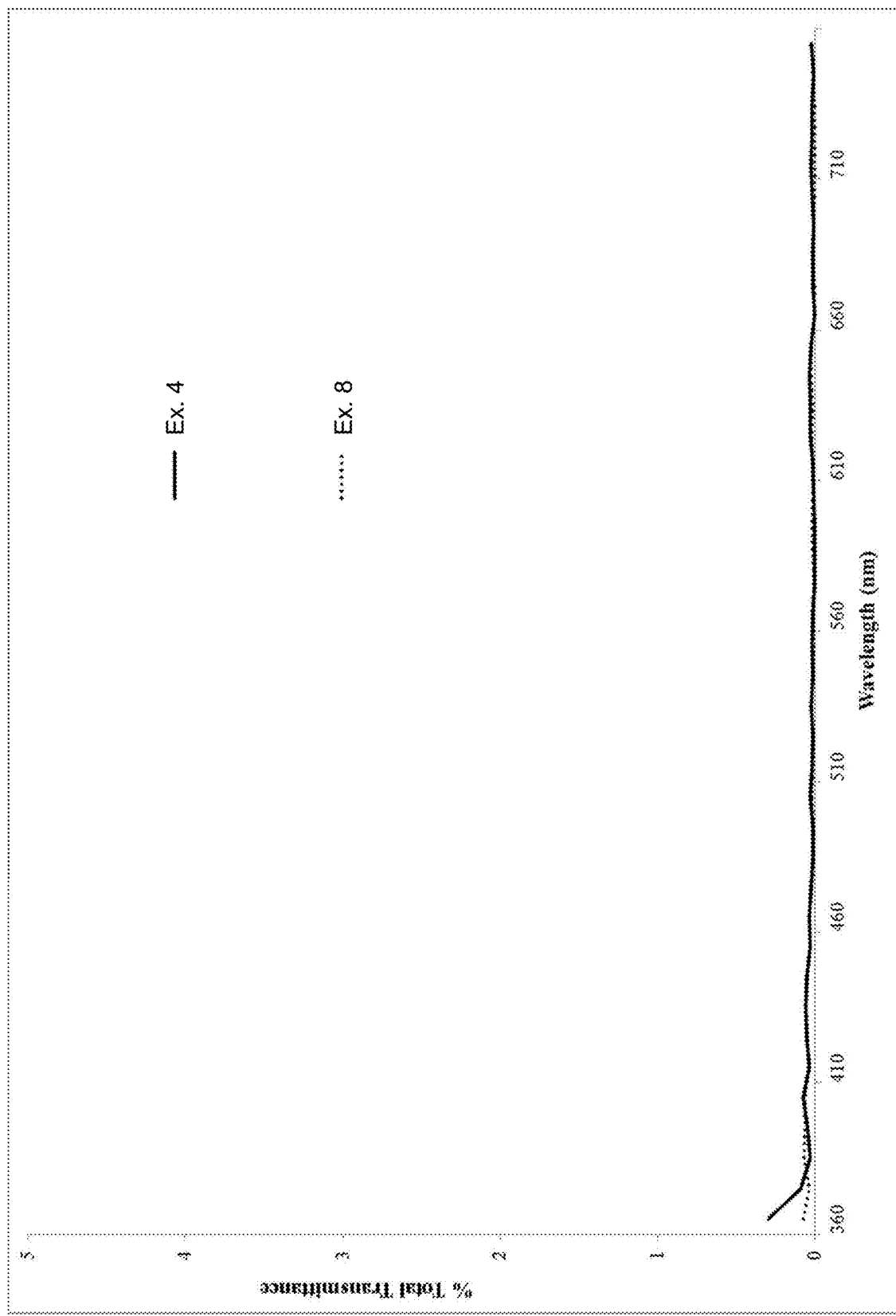
FIG. 9 is a transmittance spectrum of glass ceramics having a thickness of 0.8 mm according to embodiments.

The transmittance was measured for 0.8 mm thick samples of Examples 4 and 8 of Table 1. As shown in FIG. 9, the glass ceramic of Examples 4 and 8 have a transmittance of less than 1% in the visible wavelength range.

Figure 10:
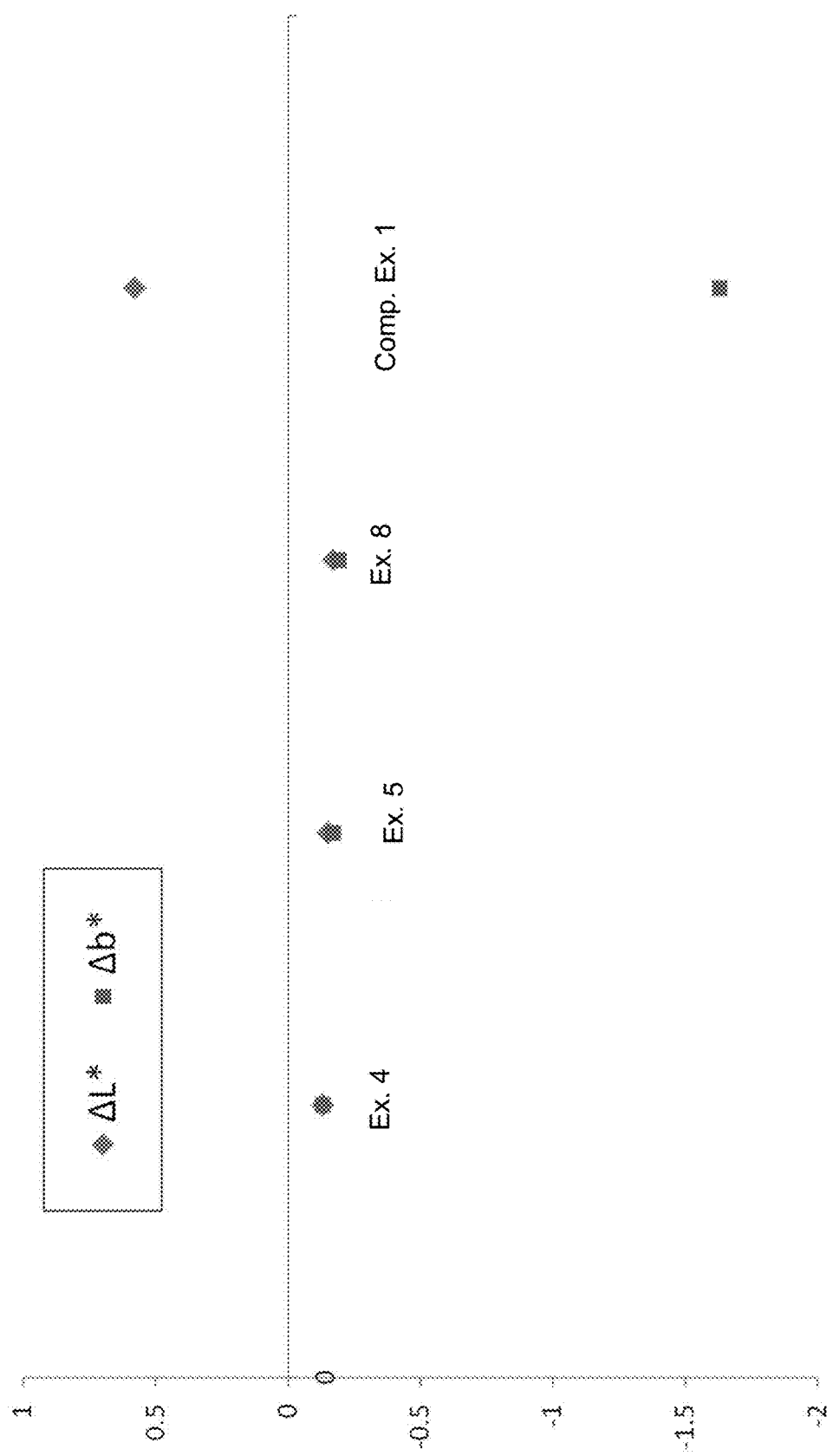
FIG. 10 is a plot of the change in L* and b* color coordinates as a result of ion exchange treatment of glass ceramics according to embodiments and a comparative glass ceramic.

Samples of Examples 4, 5, and 8 and Comparative Example 1 with a thickness of 0.8 mm were ion exchanged in a NaNO$_3$ bath at a temperature of 430° C. for a time period of 1 hour. The color coordinates of the samples were measured before and after the ion exchange treatment, as described herein. The difference in the measured L* and b* values were determined and are reported in FIG. 10.

All compositional components, relationships, and ratios described in this specification are provided in wt % unless otherwise stated. All ranges disclosed in this specification include any and all ranges and subranges encompassed by the broadly disclosed ranges whether or not explicitly stated before or after a range is disclosed.

It will be apparent to those skilled in the art that various modifications and variations can be made to the embodiments described herein without departing from the spirit and scope of the claimed subject matter. Thus, it is intended that the specification cover the modifications and variations of the various embodiments described herein provided such modification and variations come within the scope of the appended claims and their equivalents.

What is claimed is:

1. A glass ceramic, comprising:
   a β-spodumene crystal phase as a primary crystal phase; and
   a gahnite crystal phase as a minor crystal phase,
   armalcolite as a minor crystal phase;
   wherein the glass ceramic is characterized by the following color coordinates:
   L*: 20.0 to 40.0;
   a*: −1.0 to 0.5; and
   b*: −5.0 to 1.0.

2. The glass ceramic of claim 1, further comprising pseudobrookite as a minor crystal phase.

3. The glass ceramic of claim 1, wherein the glass ceramic has a transmittance of less than or equal to 1% in the visible light range.

4. The glass ceramic of claim 1, further comprising:
   greater than or equal to 60 wt % to less than or equal to 70 wt % SiO$_2$;
   greater than or equal to 15 wt % to less than or equal to 25 wt % Al$_2$O$_3$;
   greater than or equal to 3 wt % to less than or equal to 5 wt % Li$_2$O;
   greater than or equal to 0 wt % to less than or equal to 2 wt % Na$_2$O;
   greater than or equal to 0.5 wt % to less than or equal to 3 wt % MgO;
   greater than or equal to 0.5 wt % to less than or equal to 4 wt % ZnO;
   greater than or equal to 2 wt % to less than or equal to 6 wt % TiO$_2$;
   greater than or equal to 0.1 wt % to less than or equal to 1.0 wt % SnO$_2$;
   greater than or equal to 0.2 wt % to less than or equal to 3.0 wt % Fe$_2$O$_3$; and
   greater than or equal to 0.1 wt % to less than or equal to 2.0 wt % Co$_3$O$_4$.

5. The glass ceramic of claim 1, further comprising greater than or equal to 65 wt % to less than or equal to 67 wt % SiO$_2$.

6. The glass ceramic of claim 1, further comprising less than or equal to 15 wt % Li$_2$O.

7. The glass ceramic of claim 1, further comprising greater than or equal to 0 wt % to less than or equal to 5 wt % Na$_2$O.

8. The glass ceramic of claim 1, further comprising greater than 0 wt % to less than or equal to 1.5 wt % Fe$_2$O$_3$.

9. The glass ceramic of claim 1, wherein the glass ceramic has a crystallinity of greater than or equal to 50 wt %.

10. The glass ceramic of claim 1, wherein β-spodumene is the only primary crystal phase.

11. The glass ceramic of claim 1, further comprising a grain size of greater than or equal to 0.1 μm to less than or equal to 1.0 μm.

12. The glass ceramic of claim 1, wherein the glass ceramic is ion exchanged and comprises a compressive stress layer extending from a surface of the glass ceramic into the glass ceramic.

13. A consumer electronic product, comprising:
   a housing comprising a front surface, a back surface and side surfaces;
   electrical components at least partially within the housing, the electrical components comprising at least a controller, a memory, and a display, the display at or adjacent the front surface of the housing; and
   a cover glass disposed over the display,
   wherein at least a portion of the housing comprises the glass ceramic of claim 1.

14. A consumer electronic product, comprising:
   a housing comprising a front surface, a back surface and side surfaces;
   electrical components at least partially within the housing, the electrical components comprising at least a controller, a memory, and a display, the display at or adjacent the front surface of the housing; and
   a cover glass disposed over the display,
   wherein at least a portion of the housing comprises the glass ceramic of claim 12.

15. A glass ceramic, comprising:
   a β-spodumene crystal phase as a primary crystal phase;
   armalcolite as a minor crystal phase;
   greater than or equal to 0.2 wt % to less than or equal to 3.0 wt % Fe$_2$O$_3$; and
   greater than or equal to 0.1 wt % to less than or equal to 2.0 wt % Co$_3$O$_4$,
   wherein the glass ceramic is characterized by the following color coordinates:
   L*: 20.0 to 40.0;
   a*: −1.0 to 0.5; and
   b*: −5.0 to 1.0.

16. The glass ceramic of claim 15, further comprising pseudobrookite as a minor crystal phase.

17. The glass ceramic of claim 15, further comprising gahnite as a minor crystal phase.

18. The glass ceramic of claim 15, wherein the glass ceramic has a transmittance of less than or equal to 1% in the visible light range.

19. The glass ceramic of claim 15, further comprising:
    greater than or equal to 60 wt % to less than or equal to 70 wt % $SiO_2$;
    greater than or equal to 15 wt % to less than or equal to 25 wt % $Al_2O_3$;
    greater than or equal to 3 wt % to less than or equal to 5 wt % $Li_2O$;
    greater than or equal to 0 wt % to less than or equal to 2 wt % $Na_2O$;
    greater than or equal to 0.5 wt % to less than or equal to 3 wt % MgO;
    greater than or equal to 0.5 wt % to less than or equal to 4 wt % ZnO;
    greater than or equal to 2 wt % to less than or equal to 6 wt % $TiO_2$;
    greater than or equal to 0.1 wt % to less than or equal to 1.0 wt % $SnO_2$;
    greater than or equal to 0.2 wt % to less than or equal to 3.0 wt % $Fe_2O_3$; and
    greater than or equal to 0.1 wt % to less than or equal to 2.0 wt % $Co_3O_4$.

20. The glass ceramic of claim 15, further comprising greater than or equal to 65 wt % to less than or equal to 67 wt % $SiO_2$.

21. The glass ceramic of claim 15, further comprising less than or equal to 15 wt % $Li_2O$.

22. The glass ceramic of claim 15, further comprising greater than or equal to 0 wt % to less than or equal to 5 wt % $Na_2O$.

23. The glass ceramic of claim 15, further comprising greater than or equal to 0.2 wt % to less than or equal to 1.5 wt % $Fe_2O_3$.

24. The glass ceramic of claim 15, wherein the glass ceramic has a crystallinity of greater than or equal to 50 wt %.

25. The glass ceramic of claim 15, wherein β-spodumene is the only primary crystal phase.

26. The glass ceramic of claim 15, further comprising a grain size of greater than or equal to 0.1 μm to less than or equal to 1.0 μm.

27. The glass ceramic of claim 15, wherein the glass ceramic is ion exchanged and comprises a compressive stress layer extending from a surface of the glass ceramic into the glass ceramic.

28. A consumer electronic product, comprising:
    a housing comprising a front surface, a back surface and side surfaces;
    electrical components at least partially within the housing, the electrical components comprising at least a controller, a memory, and a display, the display at or adjacent the front surface of the housing; and
    a cover glass disposed over the display,
    wherein at least a portion of the housing comprises the glass ceramic of claim 15.

29. A consumer electronic product, comprising:
    a housing comprising a front surface, a back surface and side surfaces;
    electrical components at least partially within the housing, the electrical components comprising at least a controller, a memory, and a display, the display at or adjacent the front surface of the housing; and
    a cover glass disposed over the display,
    wherein at least a portion of the housing comprises the glass ceramic of claim 27.

30. A method, comprising:
    nucleating a precursor glass-based article to form a nucleated glass-based article;
    ceramming the nucleated glass-based article to form a glass ceramic,
    wherein the glass ceramic comprises:
        a β-spodumene crystal phase as a primary crystal phase;
        armalcolite as a minor crystal phase; and
        a gahnite crystal phase as a minor crystal phase, and
        the glass ceramic is characterized by the following color coordinates:
        L*: 20.0 to 40.0;
        a*: −1.0 to 1.0; and
        b*: −5.0 to 2.0.

31. The method of claim 30, wherein the ceramming occurs at a temperature of greater than or equal to 900° C. to less than or equal to 1100° C.

32. The method of claim 30, wherein the ceramming occurs for a period of greater than or equal to 0.25 hours to less than or equal to 16 hours.

33. The method of claim 30, wherein the nucleating occurs at a temperature of greater than or equal to 725° C. to less than or equal to 850° C.

34. The method of claim 30, wherein the nucleating occurs for a period of greater than or equal to 0.5 hours to less than or equal to 6 hours.

35. The method of claim 30, further comprising ion exchanging the glass ceramic.

36. The method of claim 30, wherein the precursor glass-based article comprises:
    greater than or equal to 60 wt % to less than or equal to 70 wt % $SiO_2$;
    greater than or equal to 15 wt % to less than or equal to 25 wt % $Al_2O_3$;
    greater than or equal to 3 wt % to less than or equal to 5 wt % $Li_2O$;
    greater than or equal to 0 wt % to less than or equal to 2 wt % $Na_2O$;
    greater than or equal to 0.5 wt % to less than or equal to 3 wt % MgO;
    greater than or equal to 0.5 wt % to less than or equal to 4 wt % ZnO;
    greater than or equal to 2 wt % to less than or equal to 6 wt % $TiO_2$;
    greater than or equal to 0.1 wt % to less than or equal to 1.0 wt % $SnO_2$;
    greater than or equal to 0.2 wt % to less than or equal to 3.0 wt % $Fe_2O_3$; and
    greater than or equal to 0.1 wt % to less than or equal to 2.0 wt % $Co_3O_4$.

37. The method of claim 30, wherein the precursor glass-based article comprises greater than 0 wt % to less than or equal to 1.5 wt % $Fe_2O_3$.

38. A method, comprising:
    nucleating a precursor glass-based article to form a nucleated glass-based article;
    ceramming the nucleated glass-based article to form a glass ceramic,
    wherein the glass ceramic comprises:
        a β-spodumene crystal phase as a primary crystal phase;
        armalcolite as a minor crystal phase;
        greater than or equal to 0.2 wt % to less than or equal to 3.0 wt % $Fe_2O_3$; and
        greater than or equal to 0.1 wt % to less than or equal to 2.0 wt % $Co_3O_4$, the glass ceramic is characterized by the following color coordinates:
L*: 20.0 to 40.0;
a*: −1.0 to 1.0; and
b*: −5.0 to 2.0.

39. The method of claim 38, wherein the ceramming occurs at a temperature of greater than or equal to 900° C. to less than or equal to 1100° C.

40. The method of claim 38, wherein the ceramming occurs for a period of greater than or equal to 0.25 hours to less than or equal to 16 hours.

41. The method of claim 38, wherein the nucleating occurs at a temperature of greater than or equal to 725° C. to less than or equal to 850° C.

42. The method of claim 38, wherein the nucleating occurs for a period of greater than or equal to 0.5 hours to less than or equal to 6 hours.

43. The method of claim 38, further comprising ion exchanging the glass ceramic.

44. The method of claim 38, wherein the precursor glass-based article comprises:
greater than or equal to 60 wt % to less than or equal to 70 wt % $SiO_2$;
greater than or equal to 15 wt % to less than or equal to 25 wt % $Al_2O_3$;
greater than or equal to 3 wt % to less than or equal to 5 wt % $Li_2O$;
greater than or equal to 0 wt % to less than or equal to 2 wt % $Na_2O$;
greater than or equal to 0.5 wt % to less than or equal to 3 wt % MgO;
greater than or equal to 0.5 wt % to less than or equal to 4 wt % ZnO;
greater than or equal to 2 wt % to less than or equal to 6 wt % $TiO_2$;
greater than or equal to 0.1 wt % to less than or equal to 1.0 wt % $SnO_2$;
greater than or equal to 0.2 wt % to less than or equal to 3.0 wt % $Fe_2O_3$; and
greater than or equal to 0.1 wt % to less than or equal to 2.0 wt % $Co_3O_4$.

45. The method of claim 38, wherein the precursor glass-based article comprises greater than or equal to 0.2 wt % to less than or equal to 1.5 wt % $Fe_2O_3$.

* * * * *